(12) United States Patent
Sutardja

(10) Patent No.: US 7,702,929 B2
(45) Date of Patent: *Apr. 20, 2010

(54) LOW VOLTAGE LOGIC OPERATION USING HIGHER VOLTAGE SUPPLY LEVELS

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 1316 days.

This patent is subject to a terminal disclaimer.

(21) Appl. No.: 11/179,106

(22) Filed: Jul. 12, 2005

(65) Prior Publication Data

US 2006/0119390 A1 Jun. 8, 2006

Related U.S. Application Data

(63) Continuation of application No. 11/098,129, filed on Apr. 4, 2005, now Pat. No. 7,594,127.

(60) Provisional application No. 60/631,552, filed on Nov. 29, 2004, provisional application No. 60/663,933, filed on Mar. 21, 2005.

(51) Int. Cl.
*G06F 1/32* (2006.01)

(52) U.S. Cl. .................. 713/300; 713/320; 713/322

(58) Field of Classification Search ................. 713/300, 713/310, 320, 322, 375; 326/62, 63, 80, 326/82

See application file for complete search history.

(56) References Cited

U.S. PATENT DOCUMENTS

| 4,947,309 | A |   | 8/1990  | Johnson |
|---|---|---|---|---|
| 5,204,809 | A |   | 4/1993  | Andresen |
| 5,631,534 | A |   | 5/1997  | Lewis |
| 6,031,413 | A | * | 2/2000  | Mizoguchi .................. 327/538 |
| 6,311,214 | B1 |   | 10/2001 | Rhoads |
| 6,362,986 | B1 |   | 3/2002  | Schultz et al. |
| 6,509,725 | B1 |   | 1/2003  | Bernstein et al. |
| 7,168,853 | B2 | * | 1/2007  | Ainspan et al. ............. 374/170 |
| 7,373,521 | B1 |   | 5/2008  | Kawahara |
| 2001/0043530 | A1 |   | 11/2001 | Nakatsuka et al. |
| 2003/0051090 | A1 |   | 3/2003  | Bonnett et al. |
| 2003/0078891 | A1 |   | 4/2003  | Capitant |
| 2003/0095560 | A1 |   | 5/2003  | Arita et al. |

(Continued)

FOREIGN PATENT DOCUMENTS

EP  0721137  7/1996

(Continued)

OTHER PUBLICATIONS

U.S. Appl. No. 10/810,452, filed Mar. 26, 2004, Sutardja.

(Continued)

*Primary Examiner*—Mark Connolly
*Assistant Examiner*—Paul B Yanchus, III

(57) ABSTRACT

A processing system comprises a first processing module and a second processing module that communicates with the first processing module. The first and second processing modules are connected in series between first and second reference potentials. An operating system communicates with the first and second processing modules and performs at least one of load balancing and/or throttling of the first and second processing modules to reduce a difference in current consumption between the first and second processing modules.

9 Claims, 20 Drawing Sheets

U.S. PATENT DOCUMENTS

| | | |
|---|---|---|
| 2004/0075932 A1 | 4/2004 | Watson |
| 2006/0056811 A1 | 3/2006 | Sutardja |
| 2006/0056813 A1 | 3/2006 | Sutardja |
| 2006/0056814 A1 | 3/2006 | Sutardja |

FOREIGN PATENT DOCUMENTS

| | | |
|---|---|---|
| FR | 2800955 | 5/2001 |
| GB | 2374991 | 10/2002 |
| WO | WO 2004/097868 | 11/2004 |

OTHER PUBLICATIONS

U.S. Appl. No. 10/693,787, filed Oct. 24, 2003, Sutardja.
U.S. Appl. No. 10/754,187, filed Jan. 8, 2004, Sutardja.
International Search Report for Application No. 05025065.3-1242 dated Feb. 2, 2009.

* cited by examiner

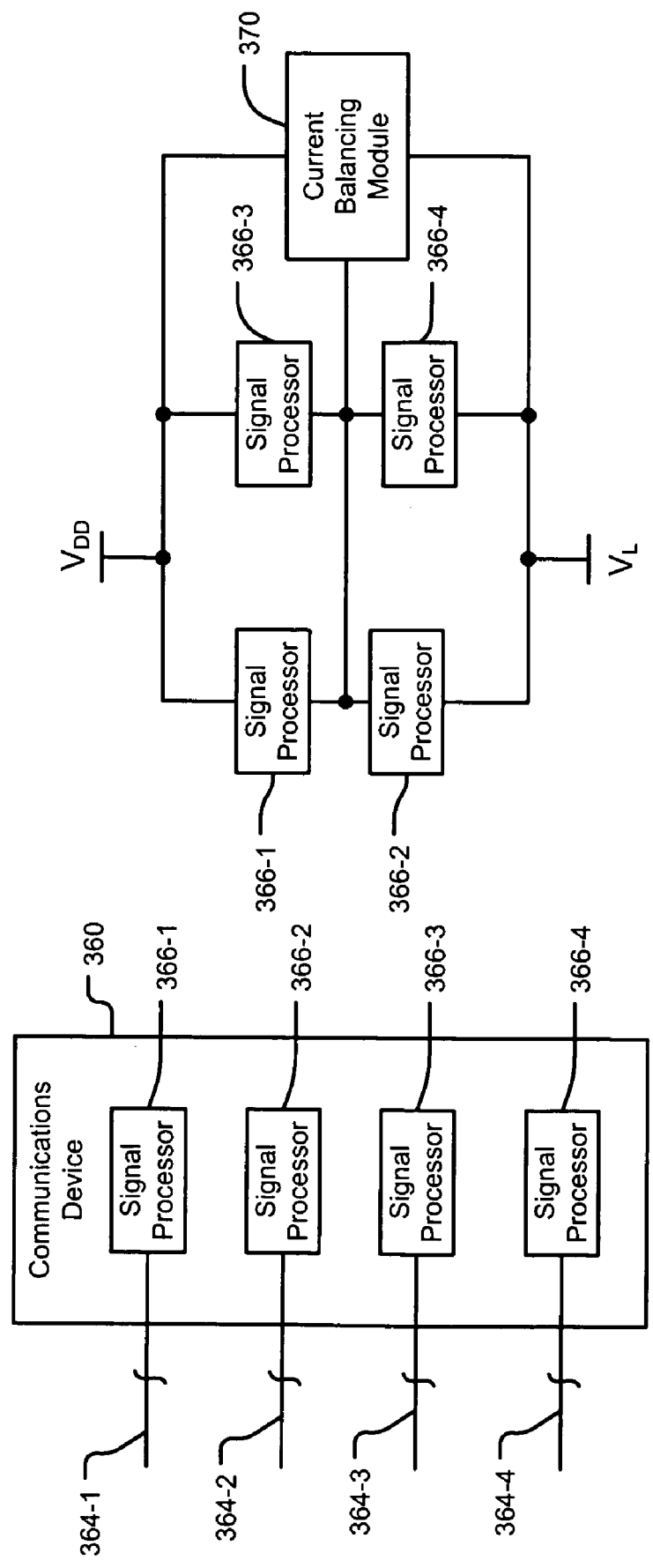

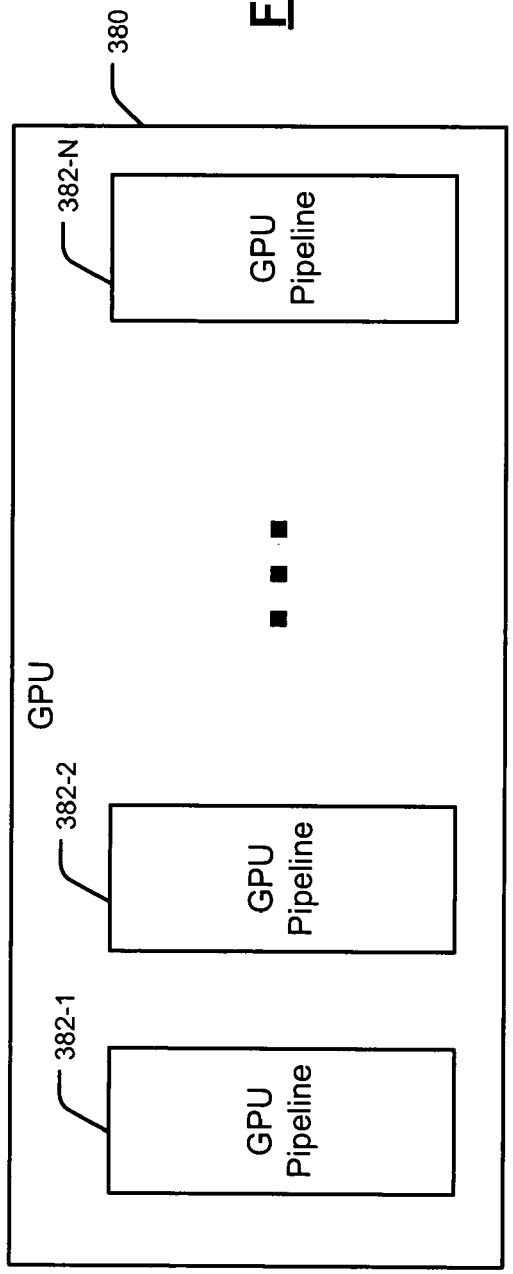
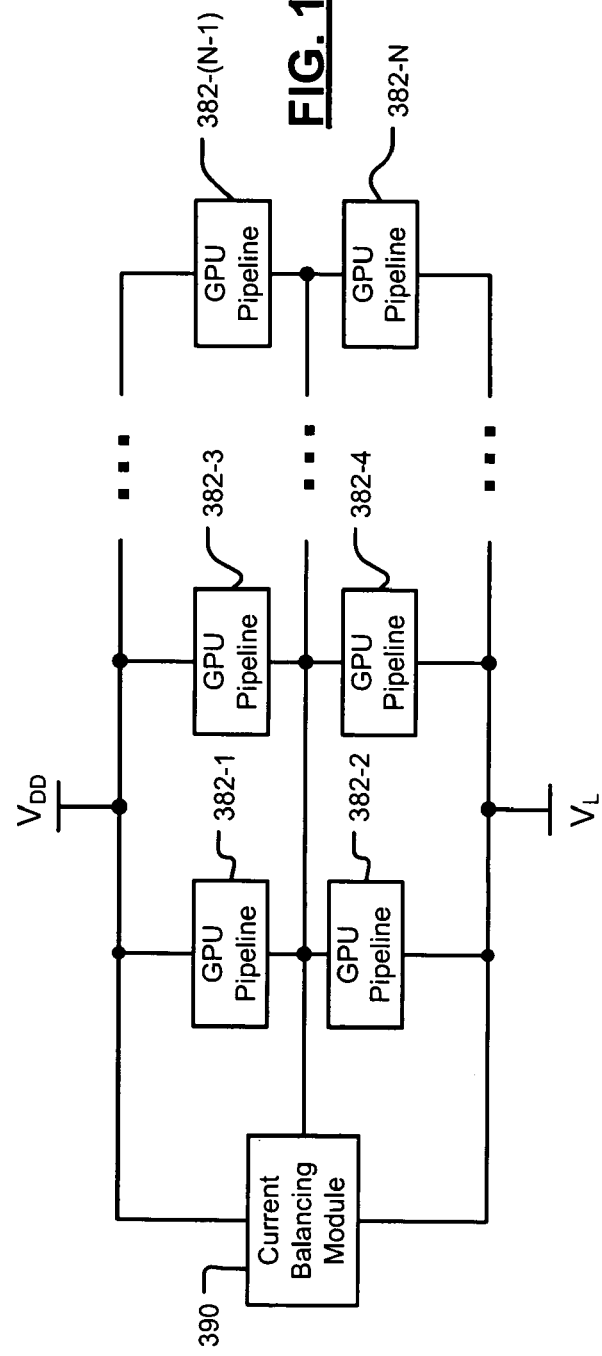

LOW VOLTAGE LOGIC OPERATION USING HIGHER VOLTAGE SUPPLY LEVELS

CROSS-REFERENCE TO RELATED APPLICATIONS

This application is a continuation of U.S. patent application Ser. No. 11/098,129, filed on Apr. 4, 2005 which claims the benefit of U.S. Provisional Application No. 60/631,552, filed on Nov. 29, 2004 and U.S. Provisional Application No. 60/663,933, filed Mar. 21, 2005. The disclosures of the above applications are incorporated herein by reference in their entirety.

FIELD OF THE INVENTION

The present invention relates to the operation of low voltage complex logic macros and/or modules using higher voltage supply levels and lower current levels.

BACKGROUND OF THE INVENTION

Complementary metal oxide semiconductor (CMOS) process scaling over the past decade has produced smaller devices through the integration of increasing numbers of transistors. For example, current microprocessors are more than a thousand times more powerful than microprocessors made a decade ago.

Power dissipation of microprocessors has also increased. Some microprocessors now dissipate more than 100 W. Modern processors built using low voltage CMOS processes employ a supply voltage level that barely exceeds 1 V. As a result, CMOS-based microprocessors require current levels that exceed 100 A.

Physical barriers are beginning to limit the amount of current flowing through these devices. One barrier relates to the voltage drop associated with the distribution of power to these microprocessors. A parasitic resistance of 1 mΩ milliohm in chip packaging and/or printed circuit board (PCB) power planes can create 100 mV of voltage drop. In reality, it is extremely difficult to lower the parasitic resistance to less than 1 MΩ megaohm without significantly increasing material and associated processing costs.

For example, the resistance of a gold bond wire in typical semiconductor packaging has a resistance of about 100 MΩ for a 1 micron diameter and 5 mm length. To limit the total power supply resistance to less than 1 MΩ, each power supply connection ($V_{DD}$ and $V_{SS}$) must be limited to less than 0.5 MΩ. This approach requires more than 400 bond wires. A lot more bondwires will be required due to other sources of parasitic resistance.

One approach eliminates the bond wires and uses flip chip packaging technology. This approach solves half of the packaging resistance problem. Additional considerations include the resistance of the metal within the semiconductor itself, the metal resistance of the flip chip packaging, and the metal resistance of the printed circuit board (PCB) must also be accommodated. As the chips continue to shrink, the traces of the wiring must be made narrower. As a result, thinner metal material must be used, which in turn increases the parasitic resistances.

SUMMARY OF THE INVENTION

A circuit comprises a first module and a second module that communicates with the first module. The first and second modules are connected in series between first and second reference potentials. A current balancing module communicates with a node between the first and second modules and reduces a difference in current consumption between the first and second modules.

In other features, the current balancing module comprises a buck converter. The buck converter comprises a conduction switch that communicates with a third reference potential. A freewheeling switch communicates with a fourth reference potential and the conduction switch. An inductance element communicates with the conduction and freewheeling switches and the node. A capacitance element communicates with the fourth reference potential and the node.

In other features, the current balancing module comprises a 2:1 DC/DC converter. The 2:1 DC/DC converter comprises first and second conduction switches. First and second inductance elements communicate with the first and second conduction switches. First and second freewheeling switches communicate with first and second conduction switches to provide a path for current during non-conduction periods. The 2:1 DC/DC converter further comprises a drive signal generator that generates drive signals that control the first and second conduction switches and freewheeling switches. The first and second inductance elements are wound together on a common core. The first and second conduction switches, the first and second inductance elements, and the first and second freewheeling switches are connected in a buck configuration such that an output voltage is approximately one-half the amplitude of an input voltage.

In other features, the current balancing module comprises a balanced switched capacitance device. The balanced switched capacitance device comprises a first capacitance element having a first end that communicates with the first module and the first reference potential and a second end that communicates with the node. A second capacitance element has a first end that communicates with the second module and the second reference potential and a second end that communicates with the node. A third capacitance element has first and second ends. A plurality of switches selectively connect and disconnect the first, second and third capacitances to the first and second modules to balance current consumption of the first and second modules. The plurality of switches comprise a first switch having a first end that communicates with the first end of the first capacitance element and a second end that communicates with the first end of the third capacitance element, a second switch having a first end that communicates with the first end of the second capacitance element and a second end that communicates with the second end of the third capacitance element, a third switch having a first end that communicates with the first end of the third capacitance element and a second end that communicates with the node, and a fourth switch having a first end that communicates with the second end of the third capacitance element and a second end that communicates with the node. A drive signal generator generates drive signals that control the plurality of switches.

In other features, the current balancing module comprises a linear push-pull regulator. The linear push-pull regulator comprises first and second linear push-pull regulators. The first stage of the linear push-pull regulator comprises a first operational amplifier (opamp), a first transistor having a control input that communicates with an output of the first opamp, a first terminal that communicates with a third reference potential, and a second terminal that communicates with the node. The second stage of the linear push-pull regulator comprises a second operational amplifier (opamp), a second transistor having a control input that communicates with an output of the second opamp, a first terminal that communicates with the node, and a second terminal that communicates with a fourth reference potential, and a resistance element having a first end that communicates with first inputs of the first and second opamps and a second end that communicates with the node.

In still other features, the current balancing module comprises a hysteresis comparator module. The hysteresis comparator module comprises at least one of adjustable offset module, adjustable bandwidth module and/or adjustable delay module. The circuit is an integrated circuit.

In other features, a DC/DC converter receives an input signal and generates an output signal. A second 2:1 DC/DC converter has an input that communicates with an output of the DC/DC converter and an output that communicates with an input of the 2:1 DC/DC converter.

In yet other features third and fourth modules are provided. The first, second, third and fourth modules are connected in series between the first and second reference potentials. The current balancing module comprises a first 2:1 DC/DC converter that communicates with the first reference potential, a first node between the first and second modules and a second node between the second and third modules. A second 2:1 DC/DC converter communicates with the second node, a third node between the third and fourth modules and the second reference potential. A third 2:1 DC/DC converter communicates with the first reference potential, the second node and the second reference potential.

In still other features, a device comprises the circuit and further comprises N pairs of circuits. The first module comprises a first circuit of one of the N pairs of circuits. The second module comprises a second circuit of one of the N pairs of circuits. The N pairs of circuits comprise processing circuits. A third module comprises a first circuit of another of the N pairs of circuits. A fourth module comprises a second circuit of another of the N pairs of circuits. The third and fourth modules are connected in series between the first and second reference potentials and the current balancing module communicates with a node between the third and fourth modules. The first, second, third and fourth modules comprise signal processing modules. The first, second, third and fourth modules comprise graphic pipeline modules.

In other features, a processing system comprises the device. The first module comprises a first central processing unit (CPU) and the second module comprises a second CPU. An operating system communicates with the first and second CPUs and performs at least one of load balancing and/or throttling of the first and second CPUs to reduce a difference in current consumption between the first and second CPUs.

In yet other features, the first and second CPUs are both implemented by a single integrated circuit. The current balancing module comprises a 2:1 DC/DC converter including first and second inductors. Components of the 2:1 DC/DC converter other than the first and second inductors are implemented by the integrated circuit.

In still other features, a system comprises the processing system and further comprises a printed circuit board (PCB), first and second sockets arranged on the PCB, and pins that extend from the integrated circuit and that are received by the first and second sockets. The first and second inductors are attached to the integrated circuit and arranged between the integrated circuit and the PCB.

A network device comprises a first channel module, a second channel module in series with the first channel module, a third channel module in series with the second channel module, and a fourth channel module in series with the third channel module. The first and fourth modules are connected in series between first and second reference potentials. The first, second, third and fourth channel modules are functionally equivalent.

In other features, a current balancing module communicates with nodes between the first and second channel modules, the second and third channel modules and the third and fourth channel modules and reduces a difference in current consumption between the first, second, third and fourth channel modules. The network device is 1000Base-T compliant. The network device is 10GBase-T compliant.

In other features, the current balancing module comprises a buck converter. The current balancing module comprises a 2:1 DC/DC converter. The current balancing module comprises a balanced switched capacitance device. The current balancing module comprises a linear push-pull regulator. The current balancing module comprises a hysteresis comparator module.

A processing system comprises a first processing module and a second processing module that communicates with the first processing module. The first and second processing modules are connected in series between first and second reference potentials. An operating system communicates with the first and second processing modules and performs at least one of load balancing and/or throttling of the first and second processing modules to reduce a difference in current consumption between the first and second processing modules.

In other features, a current balancing module communicates with a node between the first and second processing modules and reduces a difference in current consumption between the first and second processing modules.

In other features, the current balancing module comprises a buck converter. The current balancing module comprises a 2:1 DC/DC converter. The current balancing module comprises a balanced switched capacitance device. The current balancing module comprises a linear push-pull regulator. The current balancing module comprises a hysteresis comparator module. The first and second processing modules comprise first and second graphics pipeline modules.

The first and second processing modules are both implemented by a single integrated circuit. The current balancing module comprises a 2:1 DC/DC converter including first and second inductors. Components of the 2:1 DC/DC converter other than the first and second inductors are implemented by the integrated circuit.

A system comprises the processing system and further comprises a printed circuit board (PCB), first and second sockets arranged on the PCB, and pins that extend from the integrated circuit and that are received by the first and second sockets. The first and second inductors are attached to the integrated circuit and arranged between the integrated circuit and the PCB.

A circuit comprises $2^n$ modules that are connected in series between first and second reference potentials. $2^n-1$ nodes are arranged between adjacent ones of the $2^n$ modules. $2^n-1$ 2:1 DC/DC converters communicate with a respective one of the $2^n-1$ nodes.

In other features, the $2^n-1$ 2:1 DC/DC converters are arranged in n branches. A first branch includes one of the $2^n-1$ 2:1 DC/DC converters, a second branch includes two of the $2^n-1$ 2:1 DC/DC converters, and an nth branch includes $2^{n-1}$ of the $2^n-1$ 2:1 DC/DC converters. The modules include complex logic macros. The modules include application specific integrated circuits (ASIC). The modules include processing modules.

A method comprises performing a first function using a first module; performing a second function using a second module that communicates with the first module; connecting the first and second module in series between first and second reference potentials; and reducing a difference in current consumption between the first and second modules.

In other features, the method includes performing the reducing step using a buck converter. The method includes performing the reducing step using a 2:1 DC/DC converter. The method includes performing the reducing step using a balanced switched capacitance device. The method includes performing the reducing step using linear push-pull regulating module. The method includes performing the reducing step using hysteresis comparator module.

A method for operating a network device comprises providing a first communications channel; providing a second communications channel in series with the first communications channel; providing a third communications channel in series with the second communications channel; and providing a fourth communications channel in series with the third communications channel. The first and fourth communications channels are connected in series between first and second reference potentials and wherein the first, second, third and fourth communications channels are functionally equivalent.

In other features, the method includes reducing a difference in current consumption between the first, second, third and fourth communications channels. The network device is 1000Base-T compliant. The network device is 10GBase-T compliant.

In other features, the method includes performing the reducing step using a buck converter. The method includes performing the reducing step using a 2:1 DC/DC converter. The method includes performing the reducing step using a balanced switched capacitance device. The method includes performing the reducing step using linear push-pull regulating module. The method includes performing the reducing step using hysteresis comparator module.

A method comprises providing a first processing module; providing a second processing module that communicates with the first processing module, wherein the first and second processing modules are connected in series between first and second reference potentials; and performing at least one of load balancing and/or throttling of the first and second processing modules to reduce a difference in current consumption between the first and second processing modules.

In other features, the method includes reducing a difference in current consumption between the first and second processing modules.

In other features, the method includes performing the reducing step using a buck converter. The method includes performing the reducing step using a 2:1 DC/DC converter. The method includes performing the reducing step using a balanced switched capacitance device. The method includes performing the reducing step using linear push-pull regulating module. The method includes performing the reducing step using hysteresis comparator module.

The first and second processing modules are both implemented by a single integrated circuit. The 2:1 DC/DC converter includes first and second inductors. Components of the 2:1 DC/DC converter other than the first and second inductors are implemented by the integrated circuit.

First and second sockets are arranged on a PCB and pins extend from the integrated circuit and are received by the first and second sockets. The first and second inductors are attached to the integrated circuit and arranged between the integrated circuit and the PCB.

A method comprises providing $2^n$ modules that are connected in series between first and second reference potentials; providing $2^n-1$ nodes that are arranged between adjacent ones of the $2^n$ modules; and providing $2^n-1$ 2:1 DC/DC converters for converting, wherein each of the $2^n-1$ 2:1 DC/DC converters communicates with a respective one of the $2^n-1$ nodes.

In other features, the $2^n-1$ 2:1 DC/DC converters are arranged in n branches. A first branch includes one of the $2^n-1$ 2:1 DC/DC converters, a second branch includes two of the $2^n-1$ 2:1 DC/DC converters, and an nth branch includes $2^{n-1}$ of the $2^n-1$ 2:1 DC/DC converters. The $2^n$ modules include complex logic macros. The $2^n$ modules include application specific integrated circuits (ASIC). The $2^n$ modules include processing module.

A circuit comprises first means for performing a first function and second means for performing a second function and that communicates with the first means. The first and second means are connected in series between first and second reference potentials. Current balancing means communicates with a node between the first and second means and reduces a difference in current consumption between the first and second means.

In other features, the current balancing means comprises a buck converter. The buck converter comprises conduction switch means for switching that communicates with a third reference potential. Freewheeling switch means for switching communicates with a fourth reference potential and the conduction switch means. Inductance means for providing inductance communicates with the conduction and freewheeling switch means and the node. Capacitance means for providing capacitance communicates with the fourth reference potential and the node.

In other features, the current balancing means comprises 2:1 DC/DC converting means for converting. The 2:1 DC/DC converting means comprises first and second conduction switch means for switching. First and second inductance means for providing inductance communicate with the first and second conduction switch means. First and second freewheeling switch means for switching communicate with first and second conduction switch means to provide a path for current during non-conduction periods. The 2:1 DC/DC converting means further comprises drive signal generating means for generating drive signals that control the first and second conduction switch means and freewheeling switch means. The first and second inductance means are wound together on a common core. The first and second conduction switch means, the first and second inductance means, and the first and second freewheeling switch means are connected in a buck configuration such that an output voltage is approximately one-half the amplitude of an input voltage.

In other features, the current balancing means comprises balanced switched capacitance means for switching capacitance. The balanced switch capacitance means comprises first capacitance means for providing capacitance having a first end that communicates with the first means and the first reference potential and a second end that communicates with the node. Second capacitance means for providing capacitance has a first end that communicates with the second means and the second reference potential and a second end that communicates with the node. Third capacitance means for providing capacitance has first and second ends. A plurality of switch means for switching selectively connect and disconnect the first, second and third capacitance means to the first and second means to balance current consumption of the first and second means. The plurality of switch means comprise first switch means for switching having a first end that communicates with the first end of the first capacitance means and a second end that communicates with the first end of the third capacitance means, second switch means for switching having a first end that communicates with the first end of the second capacitance means and a second end that communicates with the second end of the third capacitance means, third switch means for switching having a first end that communicates with the first end of the third capacitance means and a second end that communicates with the node; and fourth switch means for switching having a first end that communicates with the second end of the third capacitance means and a second end that communicates with the node. Drive signal generating means for generating drive signals controls the plurality of switch means.

In other features, the current balancing means comprises linear push-pull regulating means for regulating. The linear push-pull regulating means comprises first and second linear push-pull regulators. The first stage of the linear push-pull regulating comprises a first operational amplifier (opamp), a first transistor having a control input that communicates with an output of the first opamp, a first terminal that communicates with a third reference potential, and a second terminal that communicates with the node. The second stage of the linear push-pull regulator comprises a second operational amplifier (opamp), a second transistor having a control input that communicates with an output of the second opamp, a first terminal that communicates with the node, and a second terminal that communicates with a fourth reference potential, and a resistance element having a first end that communicates with first inputs of the first and second opamps and a second end that communicates with the node.

In yet other features, the current balancing means comprises hysteresis comparator means for balancing current. The hysteresis comparator means comprises at least one of adjustable offset means for adjusting offset, adjustable bandwidth means for adjusting bandwidth and/or adjustable delay means for adjusting delay.

In other features, the circuit is an integrated circuit. DC/DC converting means for converting receives an input signal and generates an output signal. Second 2:1 DC/DC converting means for converting has an input that communicates with an output of the DC/DC converting means and an output that communicates with an input of the 2:1 DC/DC converting means.

In other features, the circuit includes third and fourth means for performing third and fourth functions. The first, second, third and fourth means are connected in series between the first and second reference potentials. The current balancing means comprises first 2:1 DC/DC converting means for converting that communicates with the first reference potential, a first node between the first and second means and a second node between the second and third means, second 2:1 DC/DC converting means for converting that communicates with the second node, a third node between the third and fourth means and the second reference potential, and third 2:1 DC/DC converting means for converting that communicates with the first reference potential, the second node and the second reference potential.

A device comprises the circuit and further comprises N pairs of circuits. The first means comprises a first circuit of one of the N pairs of circuits, and wherein the second means comprises a second circuit of one of the N pairs of circuits. The N pairs of circuits comprise processing means for processing. Third means for performing a third function comprises a first circuit of another of the N pairs of circuits. Fourth means for performing a fourth function comprises a second circuit of another of the N pairs of circuits. The third and fourth means are connected in series between the first and second reference potentials and the current balancing means communicates with a node between the third and fourth means. The first, second, third and fourth means comprise signal processing means for processing.

In other features, a graphics processing unit (GPU) comprises the device. The first, second, third and fourth means comprise graphic pipeline means for processing graphics.

In other features, a processing system comprises the device. The first means comprises first processing means for processing and the second means comprises second means for processing. An operating system communicates with the first and second processing means and performs at least one of load balancing and/or throttling of the first and second processing means to reduce a difference in current consumption between the first and second processing means. The first and second processing means are both implemented by a single integrated circuit.

In still other features, the current balancing means comprises a 2:1 DC/DC converting means for converting including first and second inductance means for providing inductance. Components of the 2:1 DC/DC converting means other than the first and second inductance means are implemented by the integrated circuit. A system comprises the processing system and further comprises a printed circuit board (PCB), first and second sockets arranged on the PCB, and pins that extend from the integrated circuit and that are received by the first and second sockets. The first and second inductance means are attached to the integrated circuit and arranged between the integrated circuit and the PCB.

A network device comprises first channel means for providing a first communications channel, second channel means for providing a second communications channel in series with the first channel means, third channel means for providing a third communications channel in series with the second channel means, and fourth channel means for providing a fourth communications channel in series with the third channel means. The first and fourth channel means are connected in series between first and second reference potentials and wherein the first, second, third and fourth channel means are functionally equivalent.

In other features, current balancing means for balancing current communicates with nodes between the first and second channel means, the second and third channel means and the third and fourth channel means and reduces a difference in current consumption between the first, second, third and fourth channel means. The network device is 1000Base-T compliant. The network device is 10GBase-T compliant.

In other features, the current balancing means comprises a buck converter. The current balancing means comprises 2:1 DC/DC converting means for converting. The current balancing means comprises balanced switched capacitance means for switching capacitance. The current balancing means comprises linear push-pull regulating means for regulating. The current balancing means comprises hysteresis comparator means for balancing current. The hysteresis comparator means comprises at least one of adjustable offset means for adjusting offset, adjustable bandwidth means for adjusting bandwidth and/or adjustable delay means for adjusting delay.

A processing system comprises first processing means for processing and second processing means for processing that communicates with the first processing means. The first and second processing means are connected in series between first and second reference potentials. Operating means for providing an operating system communicates with the first and second processing means and performs at least one of load balancing and/or throttling of the first and second processing means to reduce a difference in current consumption between the first and second processing means.

In other features, current balancing means communicates with a node between the first and second processing means and reduces a difference in current consumption between the first and second processing means.

In other features, the current balancing means comprises a buck converter. The current balancing means comprises 2:1 DC/DC converting means for converting. The current balancing means comprises balanced switched capacitance means for switching capacitance. The current balancing means comprises linear push-pull regulating means for regulating. The current balancing means comprises hysteresis comparator means for balancing current. The hysteresis comparator means comprises at least one of adjustable offset means for adjusting offset, adjustable bandwidth means for adjusting bandwidth and/or adjustable delay means for adjusting delay. The processing means comprise graphics pipeline means for processing graphics.

The first and second processing means are both implemented by a single integrated circuit. The current balancing means comprises a 2:1 DC/DC converting means for converting and including first and second inductance means for providing inductance. Components of the 2:1 DC/DC converting means other than the first and second inductance means are implemented by the integrated circuit.

A system comprises the processing system and further comprises a printed circuit board (PCB), first and second sockets arranged on the PCB, and pins that extend from the integrated circuit and that are received by the first and second sockets. The first and second inductors are attached to the integrated circuit and arranged between the integrated circuit and the PCB.

A circuit comprises $2^n$ means for performing $2^n$ functions, respectively, that are connected in series between first and second reference potentials, $2^n-1$ nodes that are arranged between adjacent ones of the $2^n$ means, and $2^n-1$ 2:1 DC/DC converting means for converting. Each of the $2^n-1$ 2:1 DC/DC converting means communicates with a respective one of the $2^n-1$ nodes.

In other features, the $2^n-1$ 2:1 DC/DC converting means are arranged in n branches. A first branch includes one of the $2^n-1$ 2:1 DC/DC converting means, a second branch includes two of the $2^n-1$ 2:1 DC/DC converting means, and an nth branch includes $2^{n-1}$ of the $2^n-1$ 2:1 DC/DC converting means. The $2^n$ means include complex logic macros, application specific integrated circuits (ASIC), and/or processing means for processing.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 10A is a functional block diagram illustrating a communications device including multiple communications channels each with a signal processor;

FIG. 10B is a functional block diagram illustrating the supply of voltage and current to the communications device of FIG. 10A;

FIG. 11A is a functional block diagram illustrating a graphics processing unit (GPU) including multiple graphics pipeline modules;

FIG. 11B is a functional block diagram illustrating the connection of the supply of voltage and current to the graphics pipeline modules of FIG. 11A;

DETAILED DESCRIPTION OF THE PREFERRED EMBODIMENTS

Figure 1B:
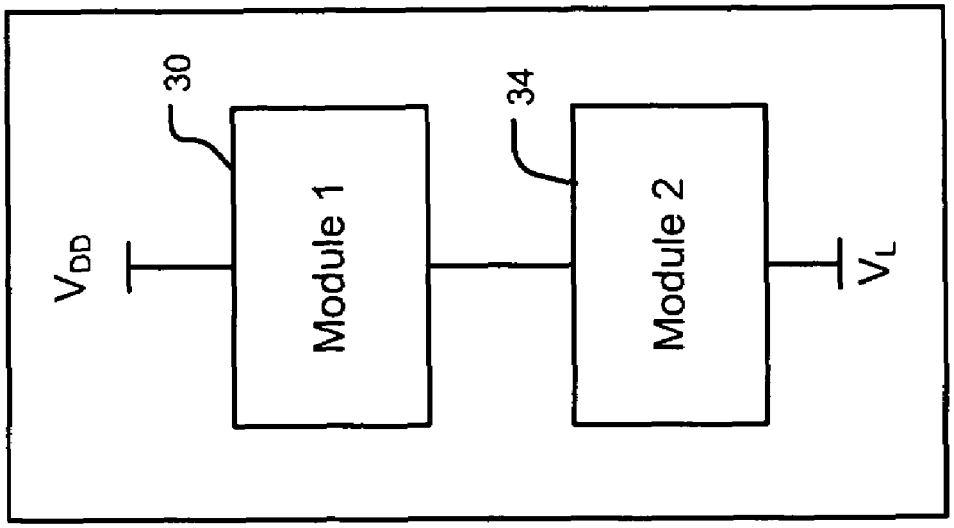
FIGS. 1A and 1B are functional block diagrams illustrating stacked complex logic macros and modules, respectively, operating at twice a normal voltage level and half of a normal current level.

The following description of the preferred embodiment(s) is merely exemplary in nature and is in no way intended to limit the invention, its application, or uses. For purposes of clarity, the same reference numbers will be used in the drawings to identify similar elements. As used herein, the term module or modules refers to an application specific integrated circuit (ASIC), an electronic circuit, a processor (shared, dedicated, or group) and memory that execute one or more software or firmware programs, a microprocessor subsystem, a combinatorial logic circuit, complex logic macros and/or other suitable components that provide the described functionality.

Figure 1A:
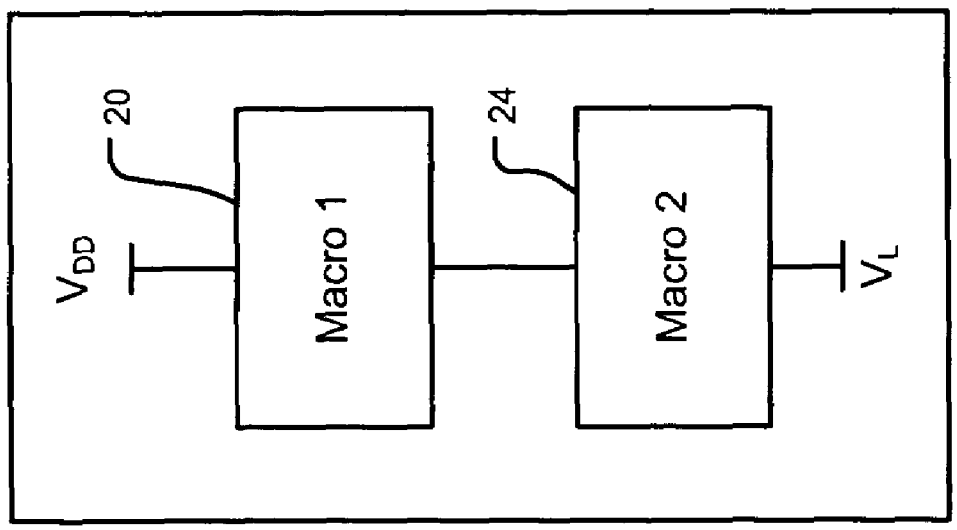

Referring now to FIGS. 1A and 1B, the present invention stacks groups of devices (such as complex logic macros and/or modules) on top of each other to overcome practical parasitic resistance barriers. In FIG. 1A, complex logic macros 20 and 24 are stacked on top of another and connected between $V_{DD}$ and $V_L$. In some implementations, $V_L$ may be ground. In FIG. 1B, modules 30 and 34 are stacked on top of another and connected between $V_{DD}$ and $V_L$. If the complexity of the complex logic macros 20 and 24 or modules 30 and 34 is approximately divided into two equal partitions and if the two halves are run approximately equally, the current requirement will be approximately half of non-stacked devices.

The stacked devices run at twice the voltage of the unstacked devices. However there is no guarantee that both the complex logic macros 20 and 24 or modules 30 and 34 will consume substantially equal current levels. This may seem to be an impossible problem to solve unless the two halves can be made to draw substantially the same amount of current. There is no way to practically guarantee that two halves will drop half of the total voltage applied to the overall device.

Figure 2B:
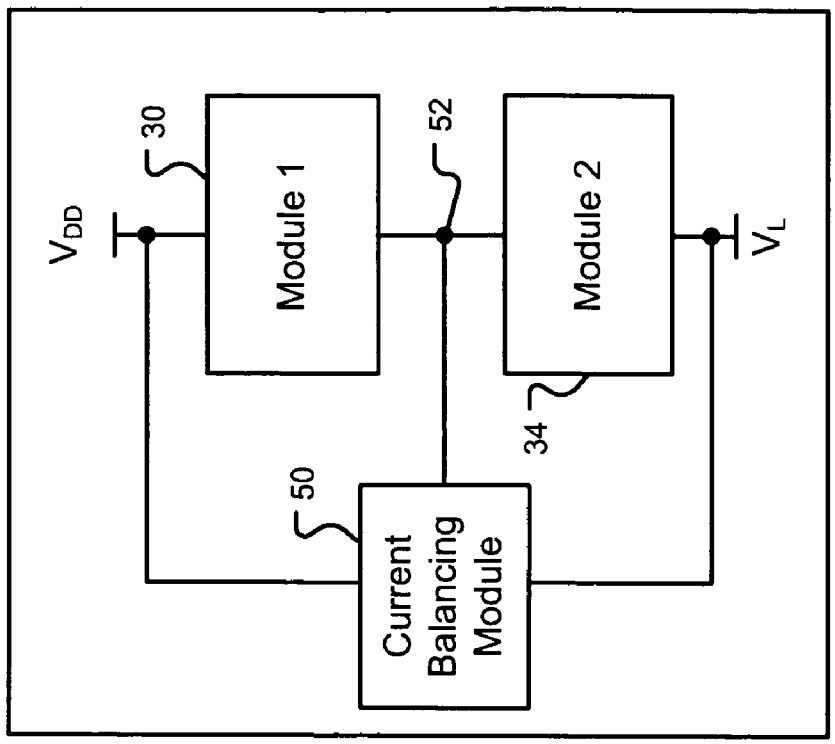
FIGS. 2A and 2B are functional block diagrams illustrating stacked complex logic macros and modules, respectively, with a current balancing module.
Figure 2A:
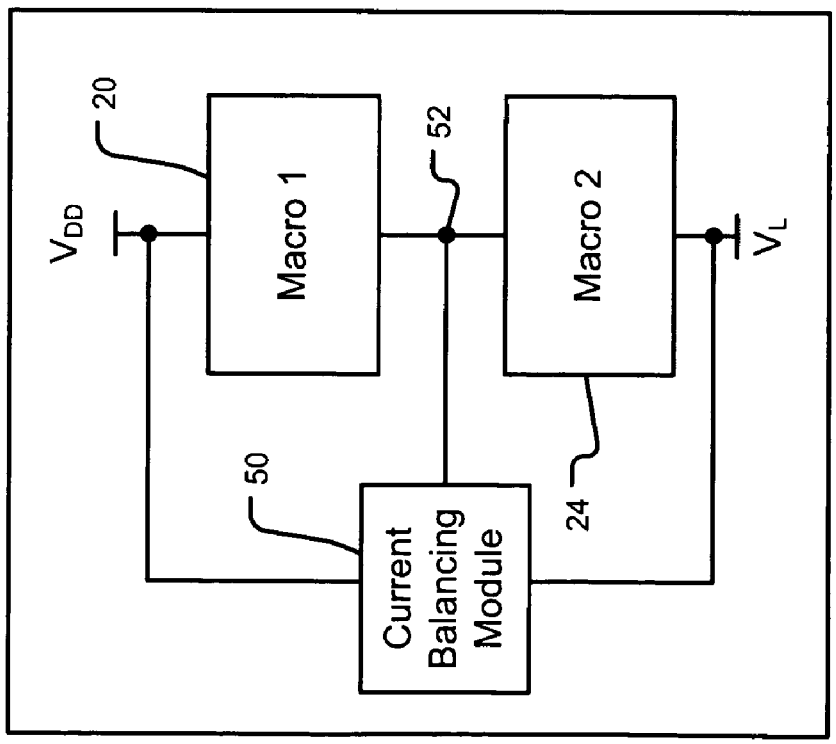

Referring now to FIGS. 2A and 2B, a current balancing module 50 according to the present invention is connected to at least one of $V_{DD}$, $V_L$ and/or a node 52 between the logic macros 20 and 24 or modules 30 and 34. The current balancing module 50 attempts to balance the amount of current supplied to the logic macros 20 and 24 or the modules 30 and 34. In particular, the current balancing module 50 supplies approximately ½ of ($V_{DD}$–$V_L$) to each of the complex logic macros 20 and 24 in FIG. 2A or to each of the modules 30 and 34 in FIG. 2B. Exemplary current balancing modules 50 include buck converters, 2:1 DC/DC converters, linear push-pull regulators, low drop-out (LDO) regulators, balancing switched capacitance devices, switched inductance devices, capacitance/inductance devices, hysteresis comparators, and/or other similar devices, as will be described further below.

Figures 3A, 3B:
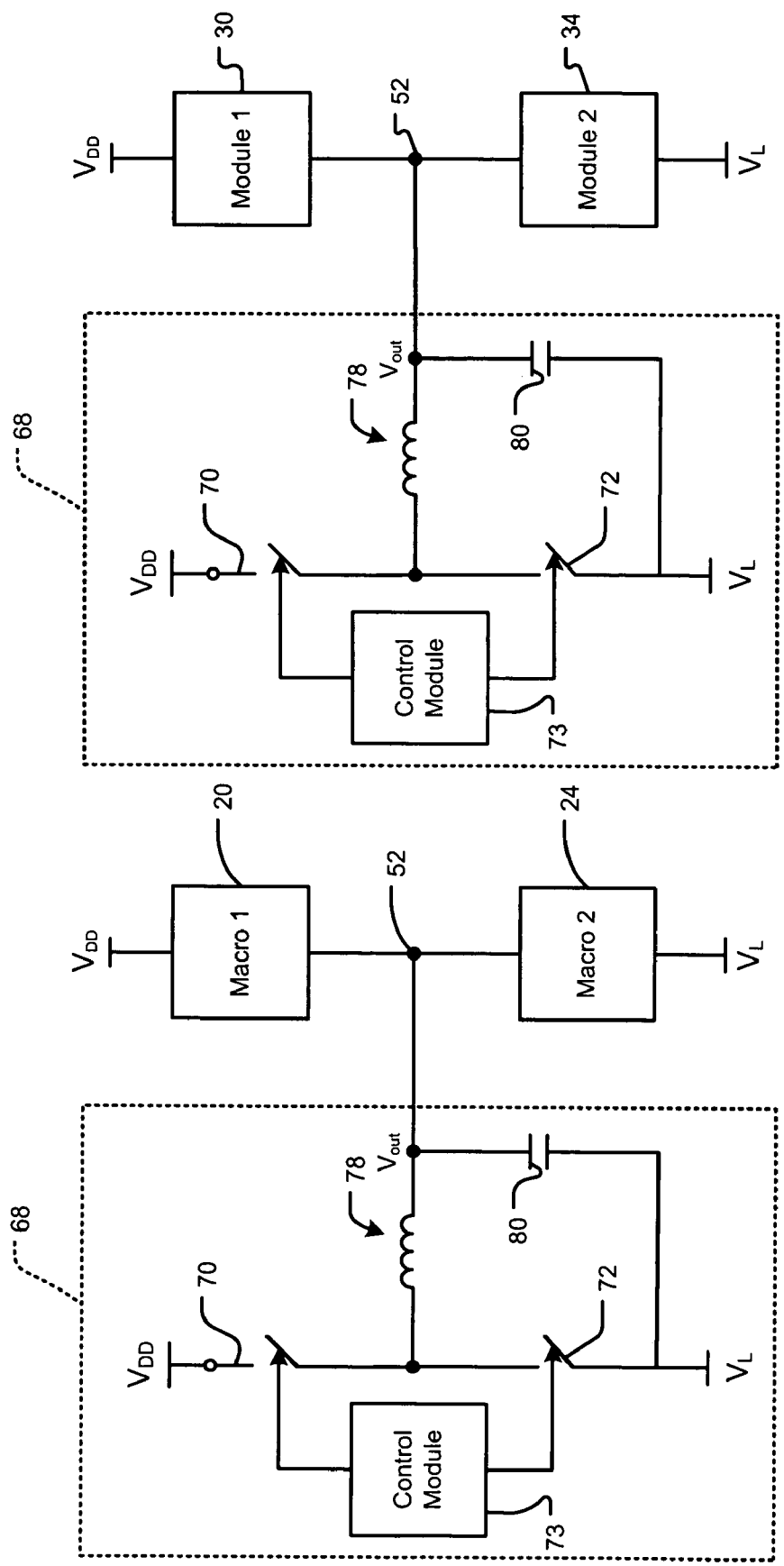
FIGS. 3A and 3B are functional block diagrams illustrating stacked complex logic macros and modules with balancing provided by a buck converter.

Referring now to FIGS. 3A and 3B, stacked complex logic macros or modules are shown with balancing provided by a buck converter 68. The buck converter 68 may have the topology shown in FIGS. 3A and 3B and/or any other suitable topology. The buck converter 68 includes a conduction switch 70 and a freewheeling switch 72. A control module 73 generates drive signals for the switches 70 and 72. The control module 73 may sense voltage and/or current at node 52 and control the switches based thereon. In some implementations, the switches 70 and 72 have opposite states. An inductance element 78 has one end that is connected between the switches 70 and 72 and an opposite end that is connected between the complex logic macros 20 and 24 or the modules 30 and 34. The buck converter 68 sinks or sources current to provide balancing.

Figure 4A:
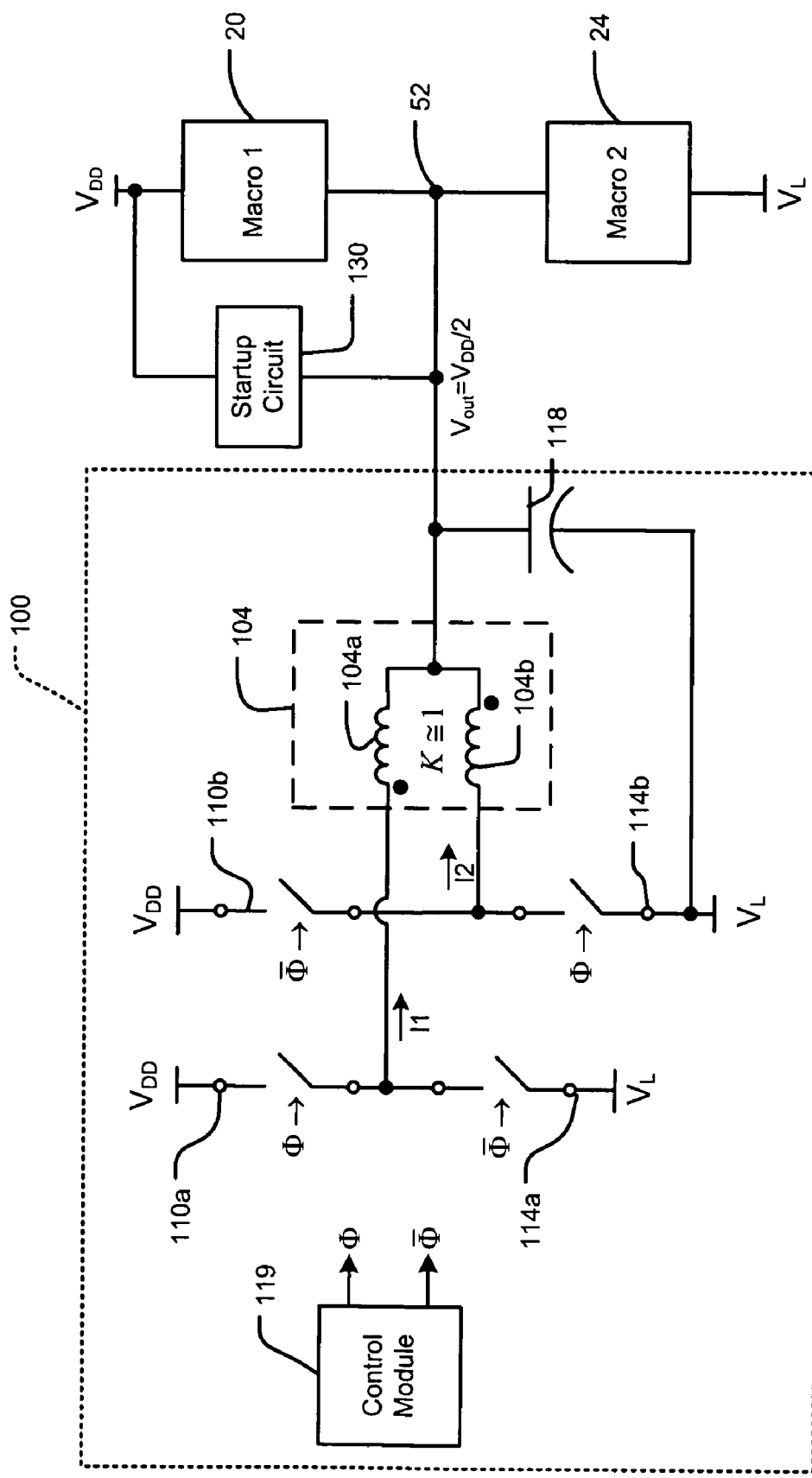
FIGS. 4A and 4B are functional block diagrams illustrating stacked complex logic macros and modules with balancing provided by a 2:1 DC/DC converter.
Figure 4B:
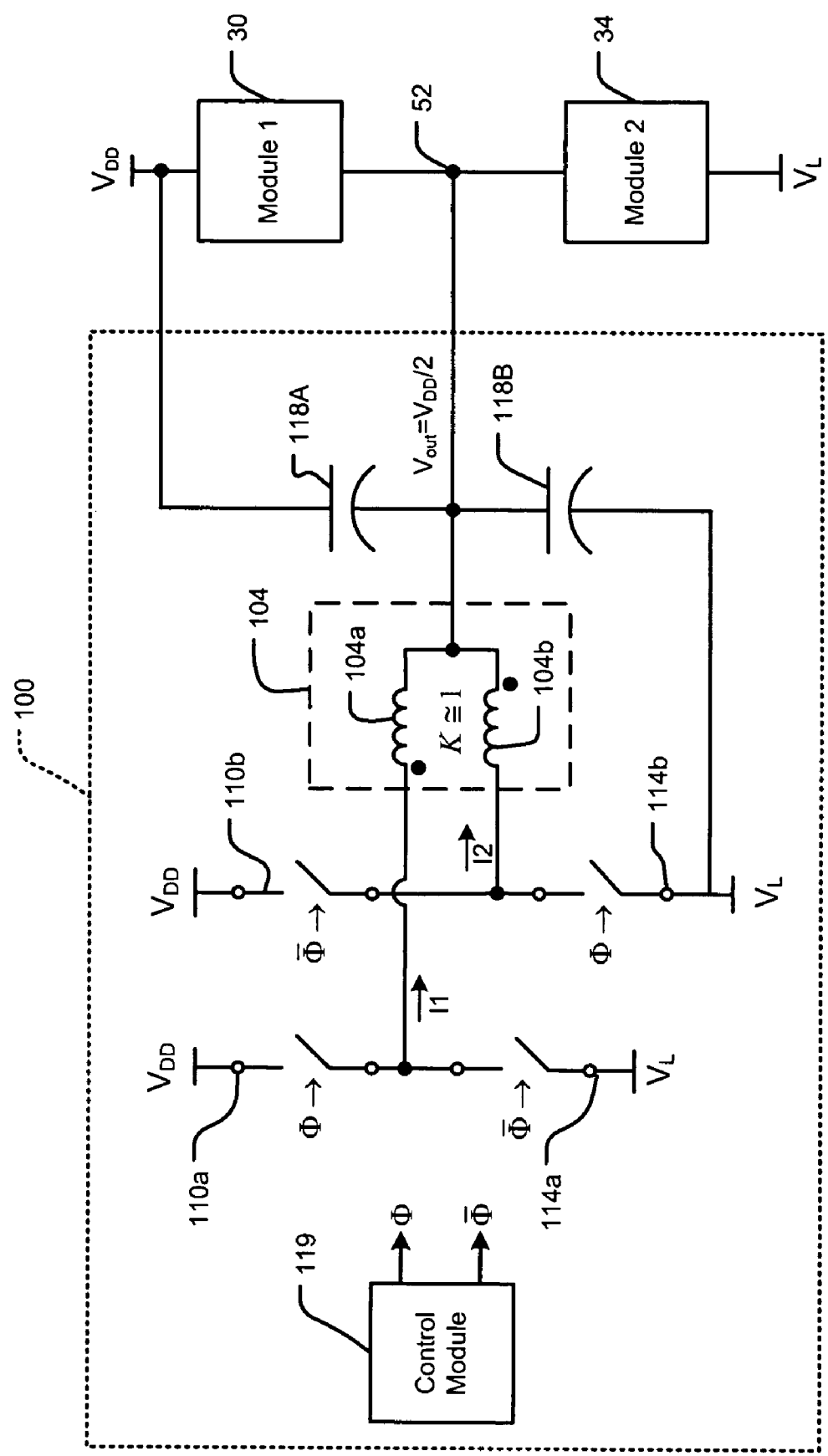

Referring now to FIGS. 4A and 4B, one implementation for balancing the current between the two halves so that the voltages seen by the two halves are approximately equal is shown. In FIG. 4A, the balancing act is accomplished by a 2:1 DC/DC converter 100 utilizing a coupled inductor 104. Further operational details are set forth in "Voltage Regulator", U.S. patent application Ser. No. 10/693,787, filed on Oct. 24, 2003, which is hereby incorporated by reference in its entirety.

The 2:1 DC/DC converter 100 includes two buck converters operating 180 degrees out of phase to generate an output voltage, $V_{OUT}$, from an input voltage $V_{DD}$. Each buck converter includes a conduction switch 110a or 110b, a freewheeling switch 114a or 114b, and an inductor 104a or 104b. An output capacitance 118 filters the output voltage for each of the buck converters. The value of the output capacitance 118 may be decreased since there is negligible ripple current. In addition, due to the tight coupling between the output and the input of the 2:1 DC/DC converter 100, any capacitance at the input works in concert with the output capacitance 118 to effectively provide parallel capacitance to a load at the output. A control module 119 generates drive signals for the switches 110a, 110b, 114a and 114b. The control module 119 may sense voltage or current at node 52 and control the switches based thereon.

A startup circuit 130 is optionally provided to ensure that the node 52 is maintained at a voltage that is less than $V_{DD}$ during startup. In some implementations, the node is maintained at approximately $V_{DD}/2$ during startup. In some implementations, the startup circuit 130 includes one or more capacitors. Alternately, $V_{DD}$ can be increased or ramped during startup to prevent excess voltage across the modules and to ensure that the node 52 is at least one of maintained at approximately $V_{DD}/2$ during startup and/or less than a threshold voltage $V_{TH}$, which is less than $V_{DD}$. The threshold $V_{TH}$ should be less than a voltage that will cause damage to the macros and/or modules.

In FIG. 4B, the output capacitance 118 of FIG. 4A is labeled 118B. Another capacitance 118A can optionally be added to ensure that the macros and/or modules do not receive more than $V_{TH}$ and/or approximately $V_{DD}/2$ during startup. Alternately, $V_{DD}$ can be increased or ramped during startup to prevent excess voltage across the macros and/or modules. Still other ways of limiting voltage during startup can be used. In some implementations, the capacitance values of the capacitances are set substantially equal.

In some implementations, the inductors, 104a and 104b, may be tightly coupled together and have a coefficient of coupling, K, of approximately one. The inductors 104a and 104b may be wound together on a common magnetic core to form an inductor assembly 104 that provides a high coefficient of coupling between the inductors 104a and 104b. The polarities of the inductor windings are selected so that the DC currents flowing through the inductors 104a and 104b approximately cancel so that approximately zero DC current flows through the magnetic core of the inductor assembly 104. Therefore, a smaller core size with a low permeability material may be used for the inductors 104a and 104b, resulting in a smaller size (volume) and lower cost for the inductor assembly 104. In addition, the transient response of the 2:1 DC/DC converter 100 is improved due to cancellation of the individual inductances as far as transient load currents are concerned.

Any excess current, whether in to or out of the node 52 of the stacked complex logic macros 20 and 24 or modules 30 and 34 will be absorbed by the 2:1 DC/DC converter 100 back into the main power supply with close to 95% efficiency. After startup, the 2:1 DC/DC converter 100 guarantees that the voltages seen by the two halves of the complex logic macros 20 and 24 or modules 30 and 34 are approximately equal. Assuming that the two halves have at most 25% mismatch in current levels, the 2:1 DC/DC converter 100 needs to sink or source 25% of the current of half of the overall device, or ⅛ of the overall current.

Figure 13B:
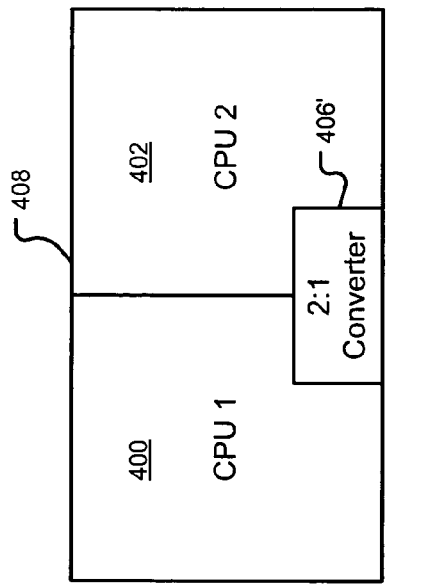
FIG. 13B is a functional block diagram illustrating an exemplary layout of the first and second processors and a 2:1 DC/DC converter on a semiconductor die.
Figure 13A:
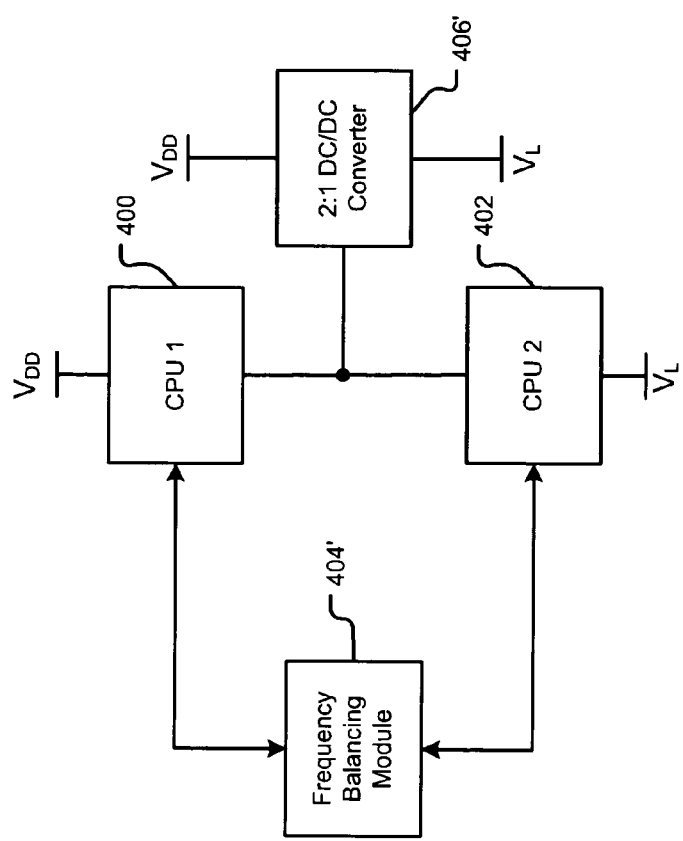
FIG. 13A is a functional block diagram illustrating first and second processors, a frequency balancing module that reduces a difference between operating frequencies of the first and second processors to reduce current imbalance and an optional 2:1 DC/DC converter.
Figure 13C:
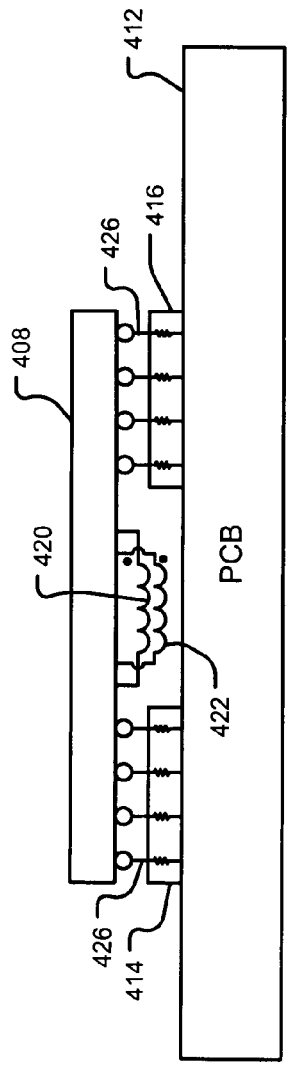
FIG. 13C is a side view illustrating packaging of the semiconductor die of FIG. 13B and external inductors on a PCB.

Returning to the microprocessor example with an original current requirement of 100 A, the 2:1 DC/DC converter 100 needs to sink or source current of less than 12.5 A. This can easily be made with integrated power MOSFETS within the microprocessor die and a single 1:1 coupled inductor 104 mounted underneath the microprocessor packaging as shown in FIGS. 13A-13C described below.

Other suitable buck converter and 2:1 converter topologies are shown and described in "Voltage Regulator", U.S. patent application Ser. No. 10/810,452, filed on Mar. 26, 2004, "Voltage Regulator:, U.S. patent application Ser. No. 10/693,787, filed on Oct. 24, 2003, and "Digital Low Dropout Regulator", U.S. patent application Ser. No. 10/754,187, filed on Jan. 8, 2004, which are hereby incorporated by reference in their entirety.

Figure 5A:
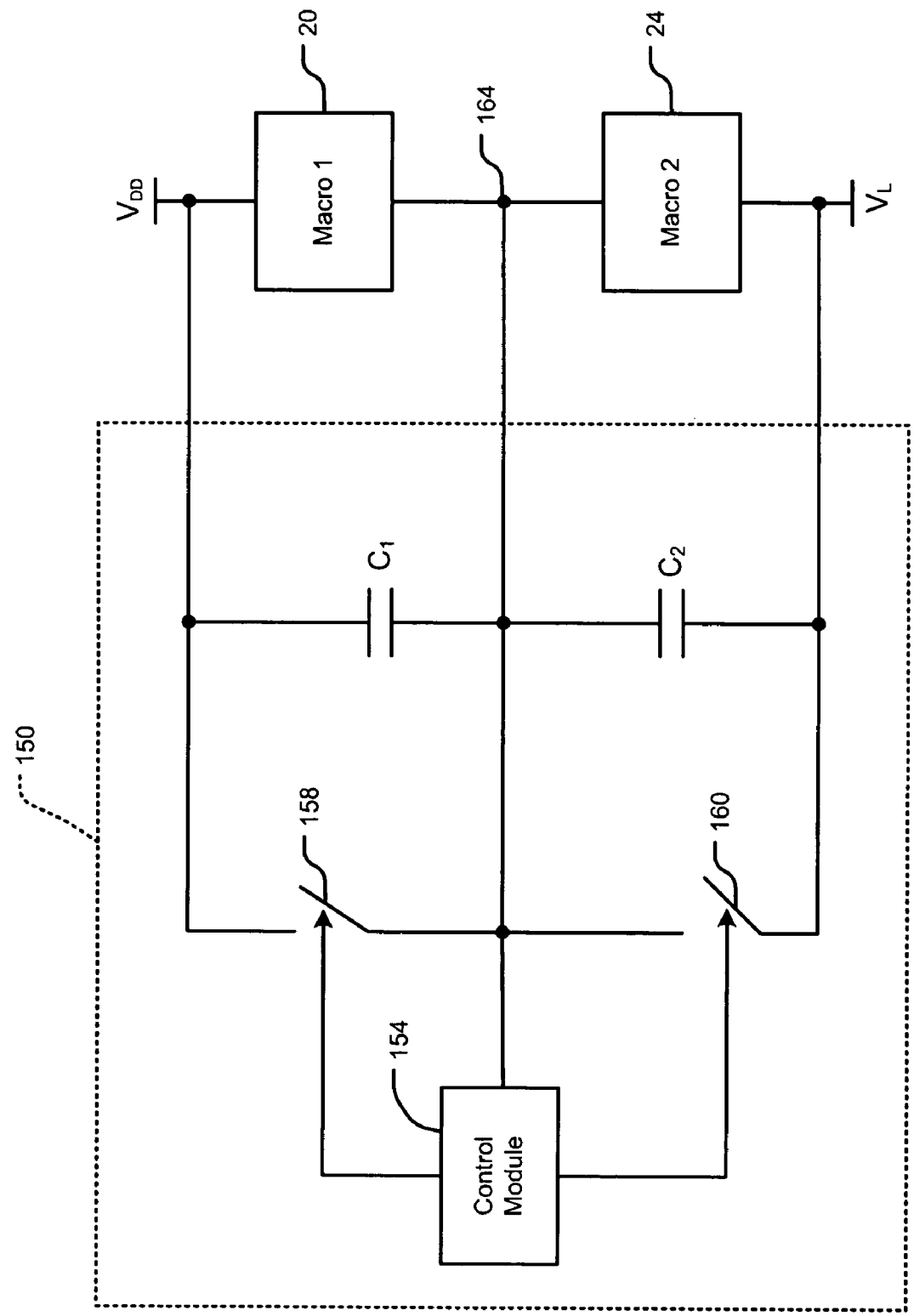
FIGS. 5A and 5B are functional block diagrams illustrating stacked complex logic macros and modules with balancing provided by first exemplary balanced switched capacitance devices.
Figure 5B:
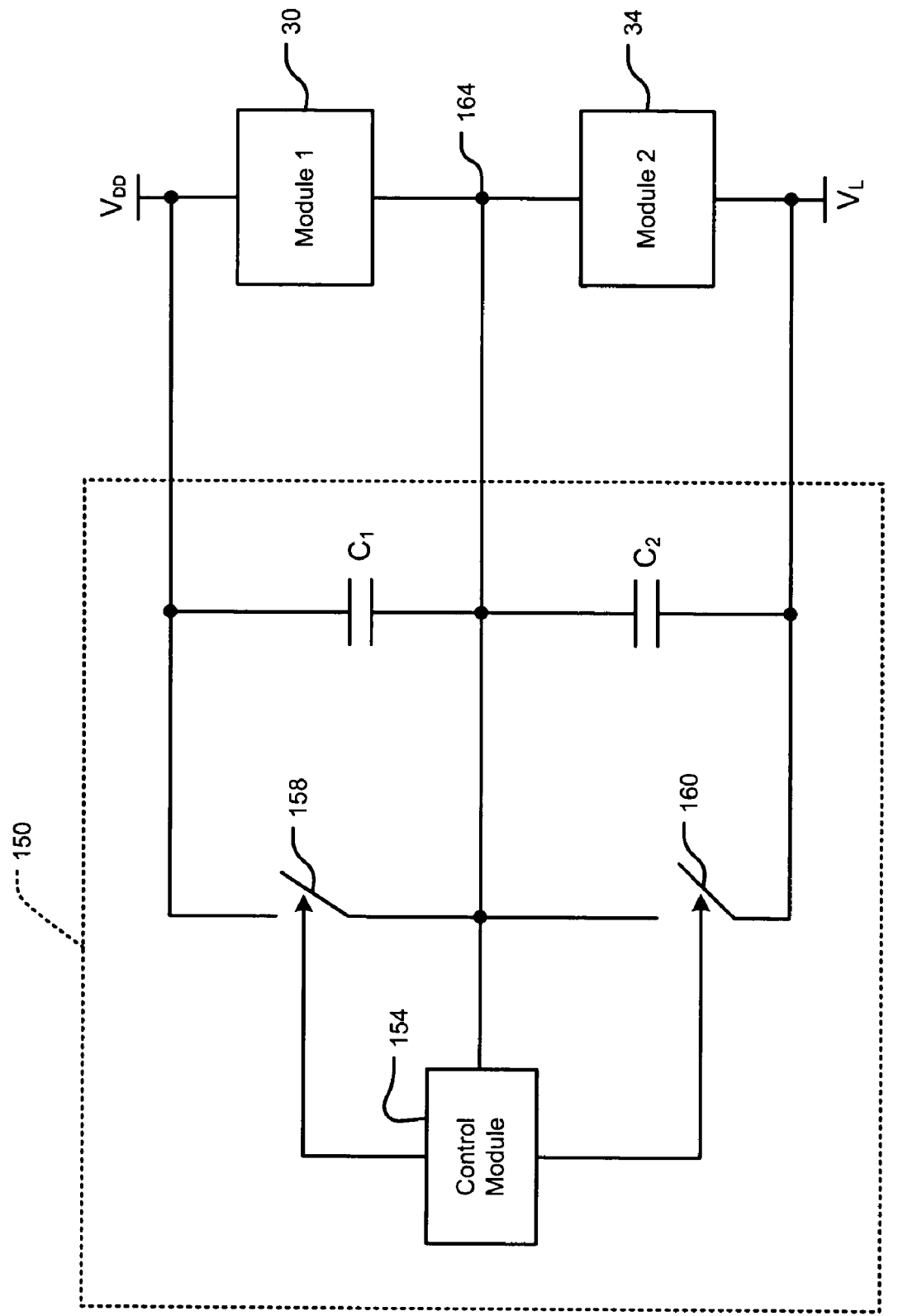

Referring now to FIGS. 5A and 5B, the stacking of complex logic macros 20 and 24 or modules 30 and 34 is not only useful for high power semiconductor devices, but also for low power integrated circuits targeted for use in handheld markets such as personal digital assistants (PDA), MP3 players, portable satellite radios, cellular phones, etc. In many handheld applications, a limited number of DC/DC converters can be used to generate the different low voltage supply levels that are required to operate modern semiconductor devices.

Stacking complex logic macros 20 and 24 or modules 30 and 34 is suited to applications where two complex logic macros or modules can be operated at low voltages and where the combined stacked voltage is already available to run an analog portion of the integrated circuit. For example, a device with a 1.8V analog supply can be used to power two halves of embedded logic running at 0.9V each. Discrepancies in the current between the two halves still need to be handled.

In this case, a balancing switched capacitance device 150 can be used to ping and pong current between the two halves as shown in FIG. 5A and 5B. A control module 154 senses current and/or voltage at node 164 and controls switches 158 and 160 to alter the charging and discharging of the capacitors $C_1$ and $C_2$. The ping and pong action of the balancing capacitors $C_1$ and $C_2$ can be used to guarantee that the voltages of the two halves are approximately equal even if there is an imbalance of the current requirements between the two halves. In some implementations, a capacitance value of $C_1$ is set substantially equal to a capacitance value of $C_2$ to prevent excess voltage across the modules 20 and 24 during startup. In other words, node 164 is maintained less than VTH and/or approximately equal to $V_{DD}/2$ during startup. While a balanced switched capacitance device is shown, skilled artisans will appreciate that switched inductance devices and/or switched capacitance/inductance devices can also be used.

Figure 6A:
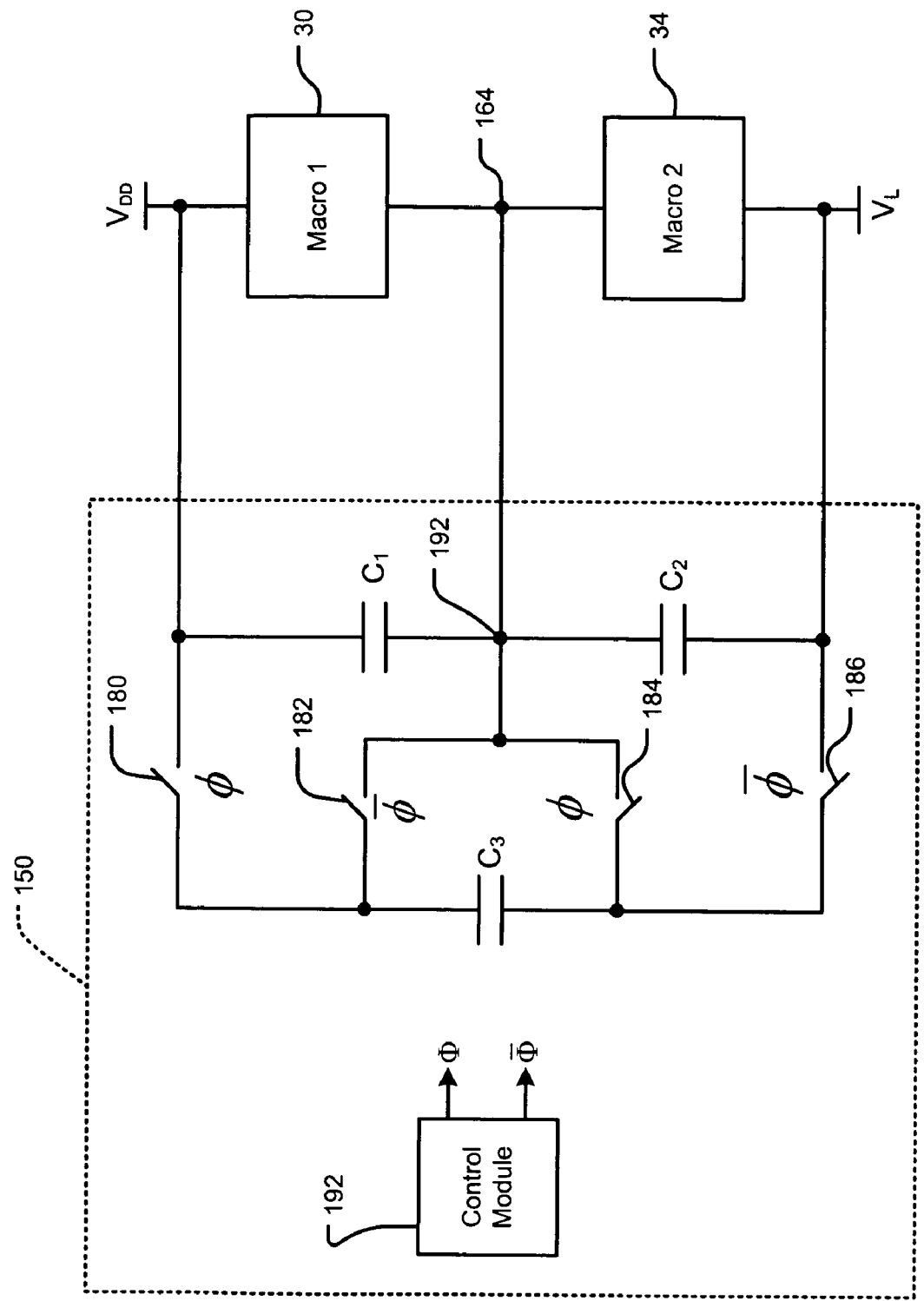
FIGS. 6A and 6B are functional block diagrams illustrating stacked complex logic macros and modules with balancing provided by second exemplary balanced switched capacitance devices.
Figure 6B:
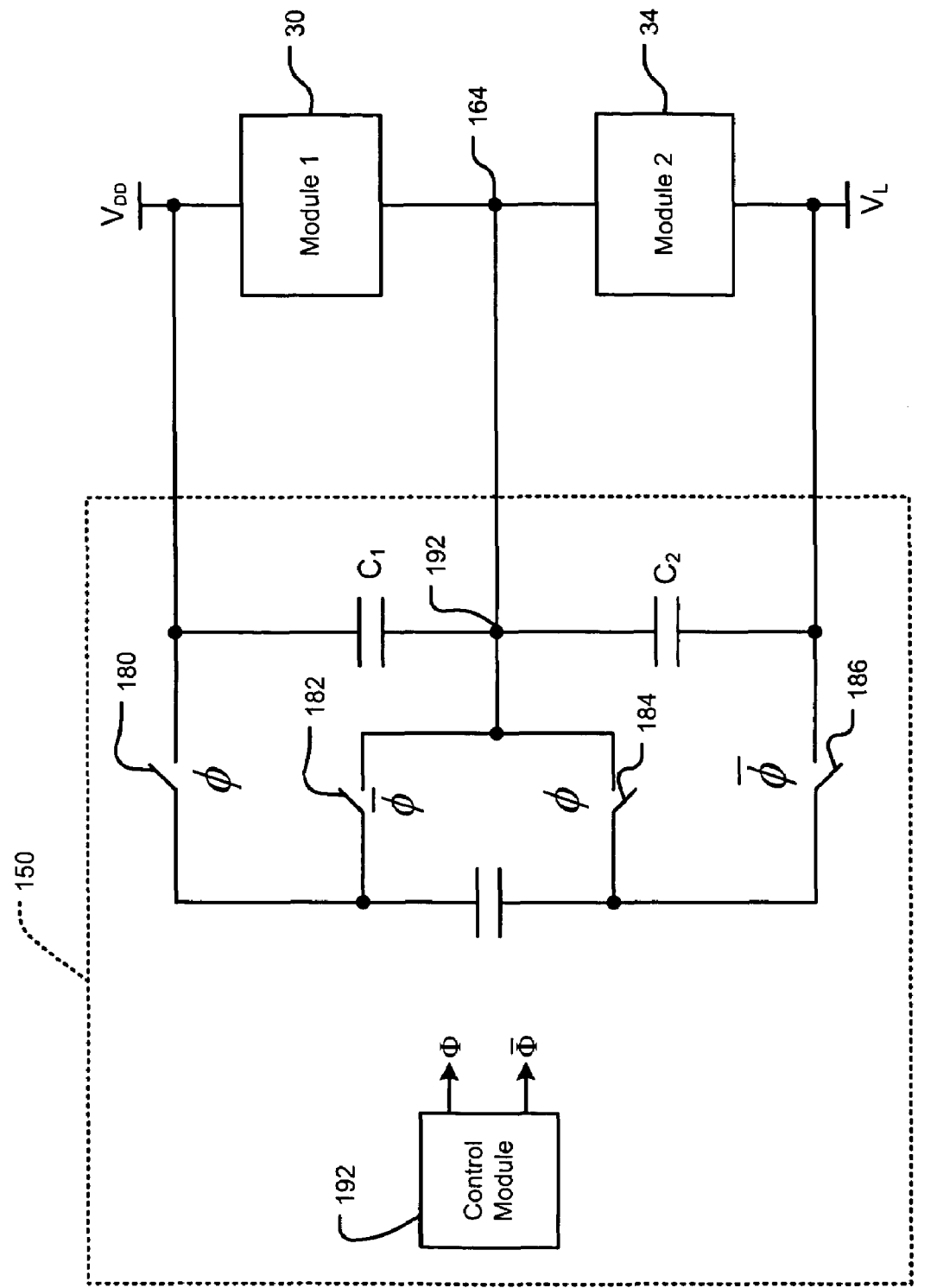

Referring now to FIGS. 6A and 6B, an alternate balanced switched capacitance device is shown to include capacitors $C_1$, $C_2$ and $C_3$, switches 180, 182, 184 and 186. A switched capacitor module 192 controls the switches 180-186 to sink or source current from node 192. In some implementations, the switches 180 and 184 are switched as a pair and the switches 182 and 186 are also switched as a pair and have the opposite state. The switched capacitance module 190 may sense the current or voltage at node 192 and control the switches based thereon. The ping and pong action of the balancing capacitors $C_1$, $C_2$ and $C_3$ can be used to guarantee that the voltages of the two halves are approximately equal even if there is an imbalance of the current requirements between the two halves.

Figure 7A:
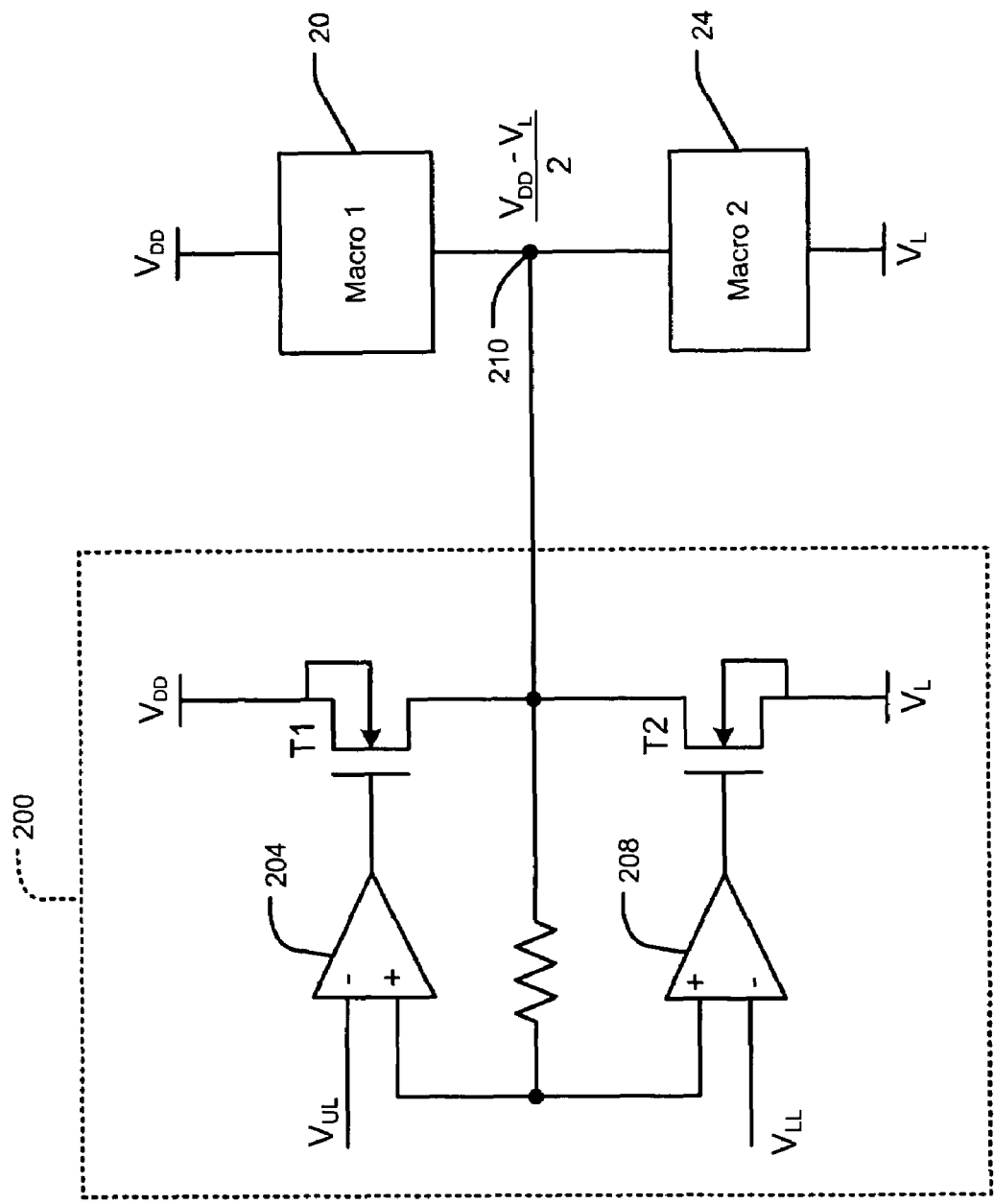
FIGS. 7A and 7B are functional block diagrams illustrating stacked complex logic macros and modules with balancing provided by a linear push-pull regulator.
Figure 7B:
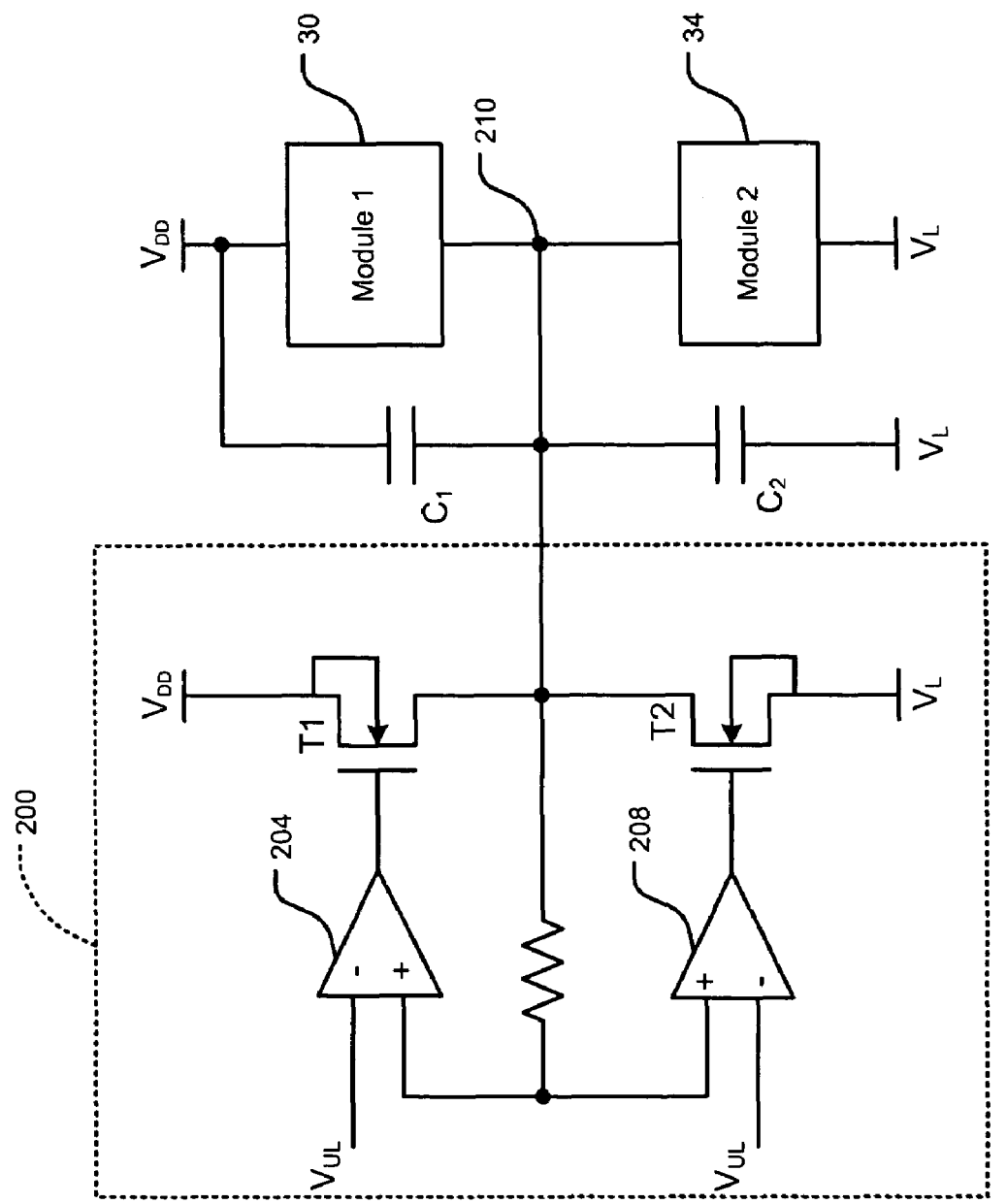

Referring now to FIGS. 7A and 7B, a linear push-pull regulator 200 can be used with some loss of efficiency. If the two halves are designed to be relatively balanced, the loss of efficiency should be minimal. This approach performs significantly better than linear regulators, which typically have only 50% efficiency. Nonetheless, linear regulators can also be used in some implementations.

The linear push-pull regulator 200 includes first and second opamps 204 and 208 having outputs that communicate with control terminals of transistors T1 and T2, respectively. In some implementations, the transistors T1 and T2 are CMOS transistors. A first terminal of the transistor T1 is coupled to $V_{DD}$. A second terminal of the transistor T1 is coupled to a first terminal of transistor T2. A second terminal of transistor T2 is coupled to $V_L$. A non-inverting input of the opamp 204 is coupled to an upper voltage threshold $V_{UL}$ and a non-inverting input of the opamp 208 is coupled to a lower voltage threshold $V_{LL}$. An inverting input of the opamp 208 is coupled to an inverting input of the opamp 204 and to one end of a resistance R. An opposite end of the resistance R is coupled to the second and first terminals of the first and second transistors T1 and T2, respectively. The second and first terminals of the first and second transistors T1 and T2, respectively, are also coupled to a node 210 between the first and second logic macros 20 and 24 in FIG. 7A or the first and second modules 30 and 34 in FIG. 7B.

When the node 210 is less than the target voltage of $$\frac{V_{DD} - V_L}{2}$$

by a first threshold $$\left( V_{UL} - \frac{V_{DD} - V_L}{2} \right),$$

the upper logic macro or module is dropping too much voltage. The upper opamp 204 turns on the transistor T1 momentarily, which applies $V_{DD}$ to node 210. $V_{DD}$ at node 210 pulls up the voltage across logic macro or module 24 or 34 and pushes down the voltage across the logic macro or module 20 or 30. When $V_{DD}$ is applied to node 210, the opamp 204 turns off T1 and the process repeats until the difference is less than the first threshold.

When the node 210 is greater than the target voltage of $$\frac{V_{DD} - V_L}{2}$$

by a second threshold $$\left( \frac{V_{DD} - V_L}{2} - V_{UL} \right),$$

the lower logic macro or module is dropping too much voltage. The lower opamp 208 turns on the transistor T2 momentarily, which applies $V_L$ to node 210. $V_L$ at node 210 pulls up the voltage across logic macro or module 20 or 30 and pushes down the voltage across the logic macro or module 24 or 34.

When $V_L$ is applied to node 210, the opamp 208 turns off T2 and the process repeats until the difference is less than the first threshold.

As can be appreciated, any type of regulator can be used. In addition to the implementations described above, other types of DC/DC converters, push pull regulators, and switched capacitance devices can be used. Still other types of regulators including but not limited to hysteretic comparators can also be used. For example, suitable hysteretic comparators include those shown and described in "Simplified Comparator with Digitally Controllable Hysteresis and Bandwidth", U.S. patent application Ser. No. 10/602,997 filed on Jun. 23, 2003, which is hereby incorporated by reference in its entirety.

In FIG. 7B, first and second capacitances $C_1$ and $C_2$ are provided to limit voltage across the modules 30 and 34 during startup to less than $V_{TH}$ approximately equal to $V_{DD}/2$ and/or. In some implementations, a capacitance value of capacitance $C_1$ is substantially equal to a capacitance value of $C_2$. In other words, node 210 is maintained at approximately $V_{DD}/2$ during startup.

Figure 8A:
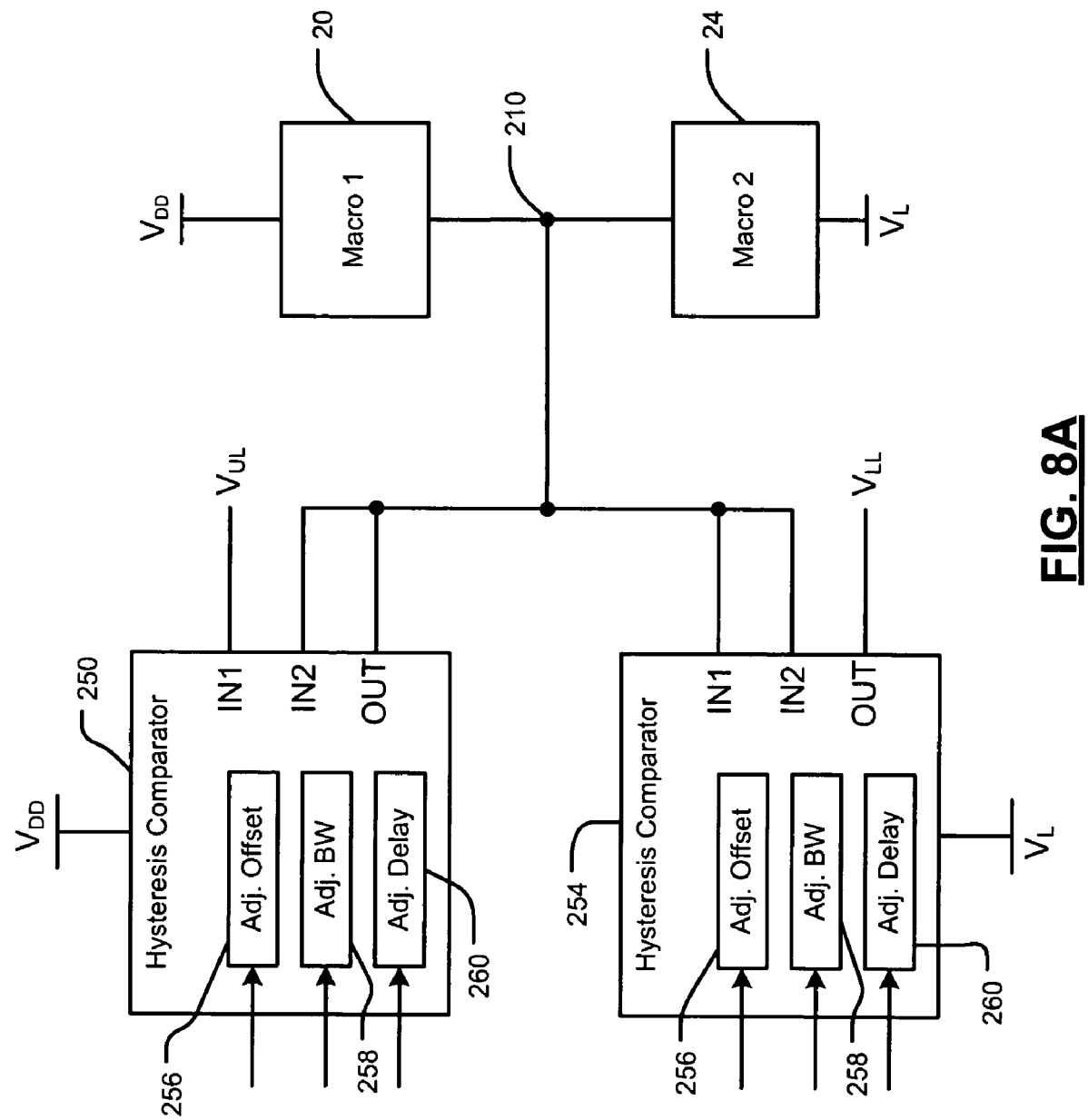
FIGS. 8A and 8B are functional block diagrams illustrating stacked logic macros and modules with balancing provided by hysteresis comparators.
Figure 8B:
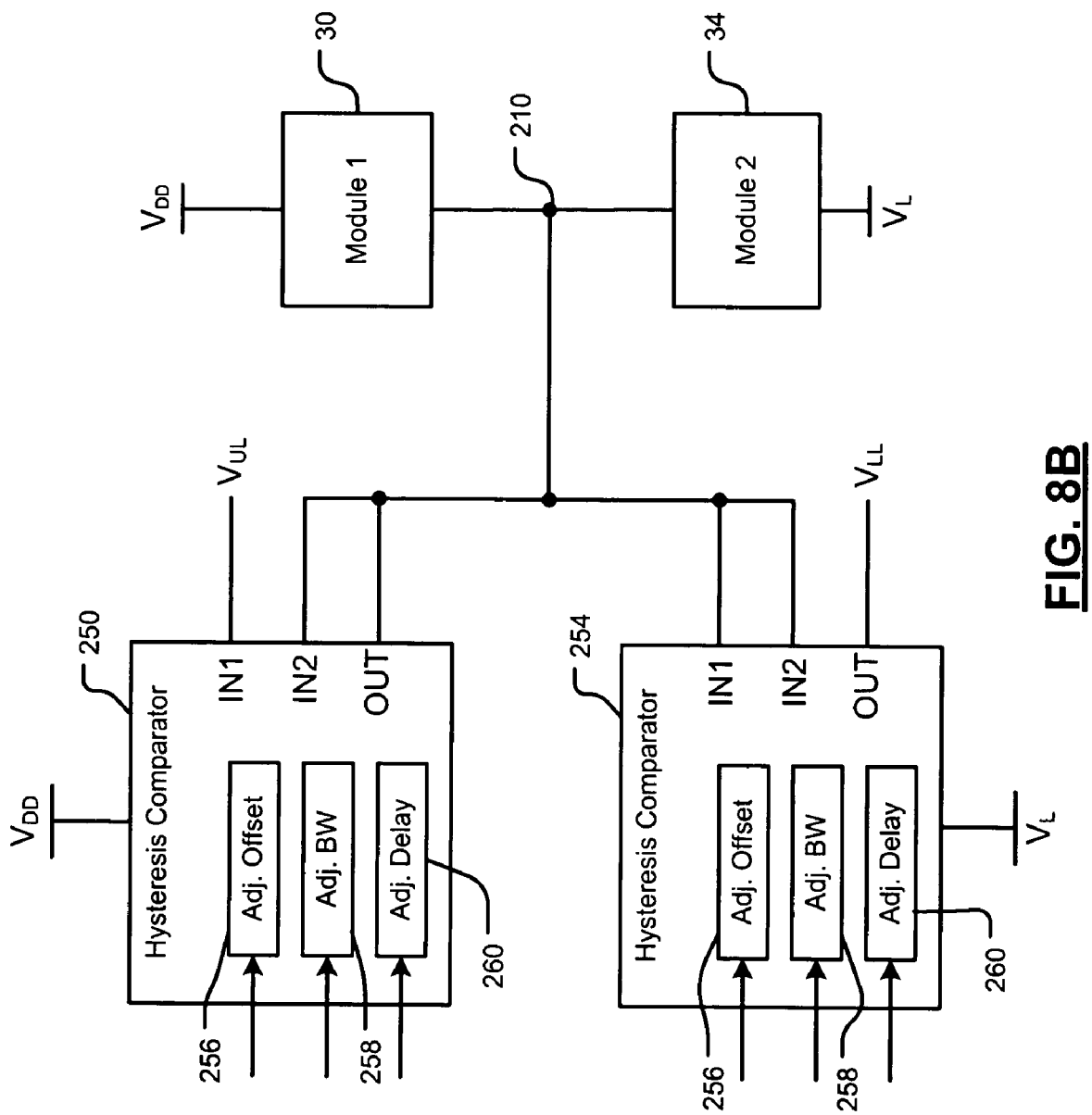

Referring now to FIGS. 8A and 8B, hysteresis comparators 250 and 254 are used to regulate the voltage across the logic macros 20 and 24 or the modules 30 and 34. Comparator 250 receives $V_{DD}$, an upper voltage threshold $V_{UL}$, and a voltage at node 210. In some implementations, the comparator 250 has fixed or adjustable offset 256, bandwidth 258 and/or delay 260. If adjustable, the comparator 254 receives one or more corresponding inputs for making the respective adjustment. Comparator 254 receives $V_L$, a lower voltage threshold $V_{LL}$, and a voltage at node 210.

When the node 210 is less than the target voltage of $$\frac{V_{DD} - V_L}{2}$$

by an upper threshold $$\left(V_{UL} - \frac{V_{DD} - V_L}{2}\right),$$

the upper logic macro or module is dropping too much voltage. The comparator 250 applies $V_{DD}$ to node 210. $V_{DD}$ at node 210 pulls up the voltage across logic macro or module 24 or 34 and pushes down the voltage across the logic macro or module 20 or 30. When $V_{DD}$ is applied to node 210 for a delay period, the comparator 250 stops applying $V_{DD}$ to node 210. The process repeats until the difference is less than the upper threshold.

When the node 210 is greater than the target voltage of $$\frac{V_{DD} - V_L}{2}$$

by a lower threshold $$\left(\frac{V_{DD} - V_L}{2} - V_{UL}\right),$$

the lower logic macro or module is dropping too much voltage. The comparator 254 applies $V_L$ to node 210. $V_L$ at node 210 pulls up the voltage across logic macro or module 20 or 30 and pushes down the voltage across the logic macro or module 24 or 34. When $V_L$ is applied to node 210 for a delay period, the comparator 254 stops applying $V_L$ to node 210. The process repeats until the difference is less than the lower threshold.

In addition, skilled artisans will appreciated that while two levels of stacking of logic macros and modules are shown, additional levels of stacking may be used. Still other balancing approaches may be used.

Figure 9A:
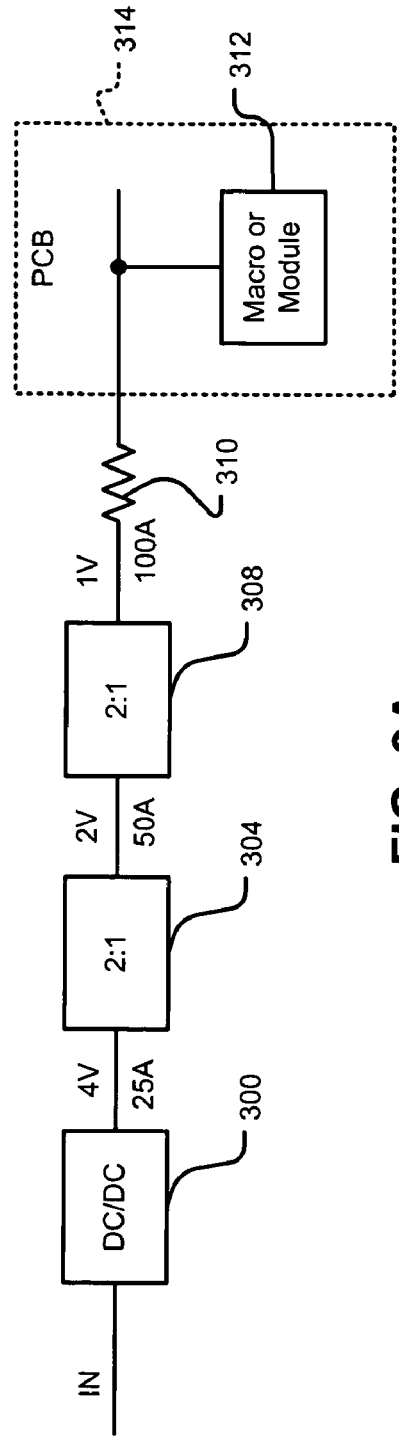
FIG. 9A is a functional block diagram illustrating the supply of voltage and current to a module or macro using a DC/DC converter and 2:1 converters according to the prior art.
Figure 9B:
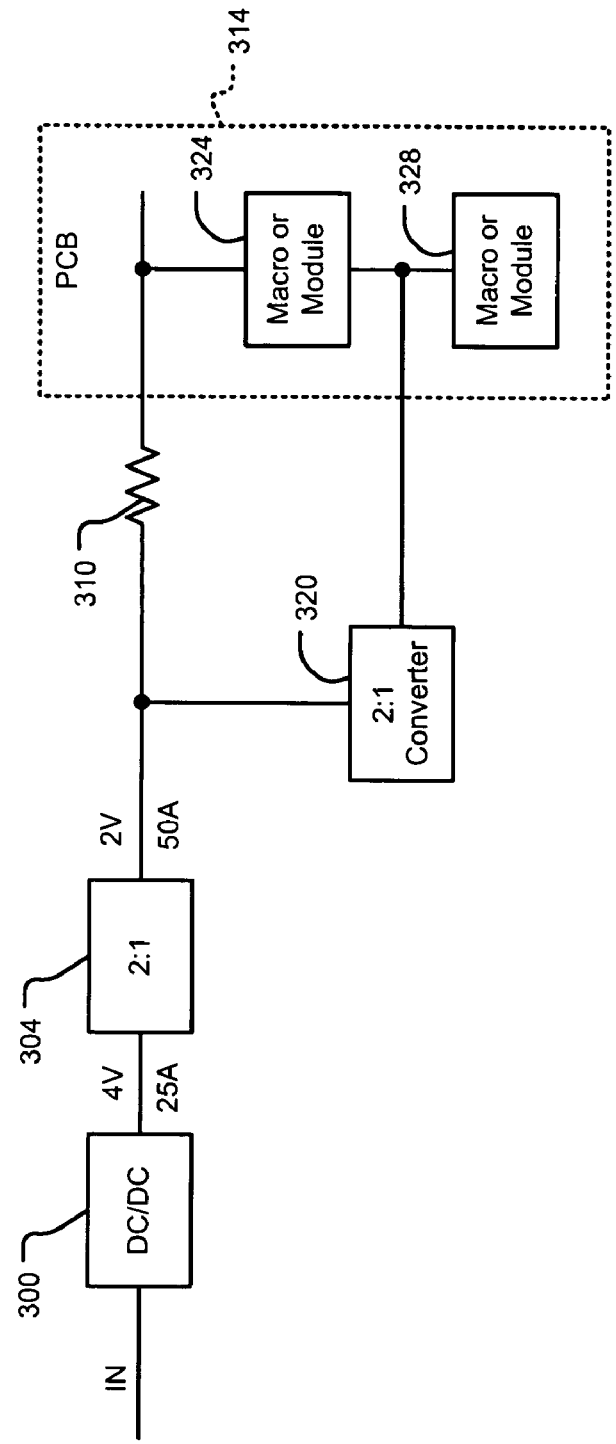
FIG. 9B is a functional block diagram illustrating the supply of voltage and current to two stacked modules or macros according to some implementations of the present invention.

Referring now to FIG. 9A, a DC/DC converter 300 receives an input signal and generates an output at 4V and 25 A. A first 2:1 converter 304 converts the 4V, 25 A input into a 2V, 50 A output. A second converter 308 converts the 2V, 50 A input into a 1V, 100 A output. A macro or module 312 packaged on a printed circuit board (PCB) 314 may be connected by a resistance 310 (which may represent parasitic resistance of traces and other connections) to the output of the 2:1 converter 308. As can be appreciated, losses due to the parasitic resistance 310 are equal to $I^2R$, where I is the current flowing through the parasitic resistance R. Referring now to FIG. 9B, the losses can be reduced by a factor of 4 according to the present invention by connecting a 2:1 converter 320 (or other current balancing module) between a pair of macros or modules identified at 324 and 328 as discussed above.

Figure 9C:
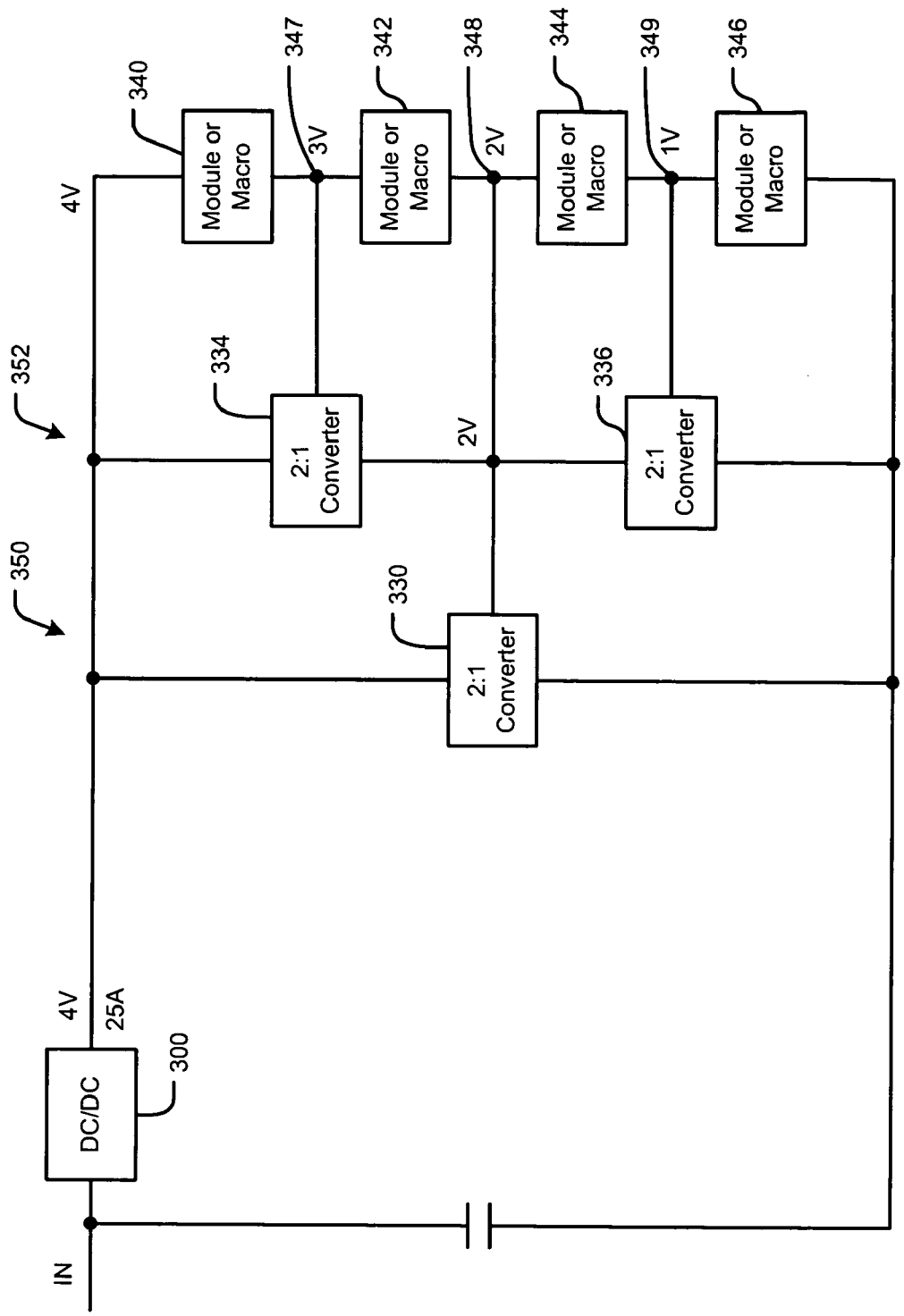
FIG. 9C is a functional block diagram illustrating the supply of voltage and current to four stacked modules or macros according to other implementations of the present invention.

Referring now to FIG. 9C, additional modules can be connected with additional 2:1 converters. In FIG. 9C, four modules or macros 340, 342, 344 and 346 are connected in series and have nodes 347, 348, and 349 therebetween. A first 2:1 converter 330 is connected to the output of the DC/DC converter 300, the macro or module 340 and to node 348. The node 348 is also connected to 2:1 converters 334 and 336 and to modules or macros 342 and 344. The 2:1 converter 334 is also connected to the output of the DC/DC converter 300, module or macro 340 and nodes 347 and 348 as shown. The 2:1 converter 336 is also connected to the nodes 348 and 349 as shown. The 2:1 converter 320 can be smaller than the 2:1 converter 308, which handles all of the current flowing to the PCB. In contrast, the 2:1 converter 320 only needs to handle current mismatch between the stacked devices.

More generally, when the circuit includes $2^n$ modules or macros, it will include $2^n-1$ 2:1 DC/DC converters. The 2:1 DC/DC converters may be arranged in n branches. The $2^n-1$ 2:1 DC/DC converters have $2^n-1$ nodes between adjacent DC/DC converters. Each of the $2^n-1$ 2:1 DC/DC converters are connected to respective ones of the $2^n-1$ nodes.

For example in FIG. 9C, there are two branches 350 and 352. The first branch 350 includes one 2:1 converter and the second branch includes two 2:1 DC/DC converters. More generally, the first branch includes $2^0$=one 2:1 DC/DC converter, the second branch includes $2^1$=two 2:1 DC/DC converters, the third branch includes $2^2$=four 2:1 DC/DC converters . . . , and the $n^{th}$ branch includes $2^{n-1}$ 2:1 DC/DC converters.

Referring now to FIGS. 10A and 10B, a communications device 360 such as a router, switch or other network device typically includes multiple communications channels 364-1, 364-2, 364-3 and 364-4 (collectively channels 364). While only four signal processor modules are shown, additional pairs of signal processors can be used. Each channel 364 includes a signal processor 366-1, 366-2, 366-3 and 366-4 (collectively signal processors 366). Since each of the signal processors 366 typically has the same design, the signal processor modules 366 tend to draw approximately the same amount of current during operation. A current balancing module 370 such as those described above or below may be provided to balance differences in current consumption. Since mismatch will be low, lower efficiency devices such as linear LDO regulators can be used, although other current balancing modules may also be used. For example, the communications channel can be compliant with 1000Base-T Ethernet, 10GBase-T Ethernet or other current or future Ethernet or other standards.

Referring now to FIGS. 11A and 11B, a graphics processing unit (GPU) 380 includes multiple graphics pipeline modules 382-1, 382-2, . . . , and 382-N (collectively graphics pipeline modules 382). Since each of the graphics pipeline modules 382 have the same design, the graphics pipeline modules 382 tend to draw the same amount of current during operation. A current balancing module 390 such as those described above or below may be provided to balance differences in current consumption.

Figure 12:
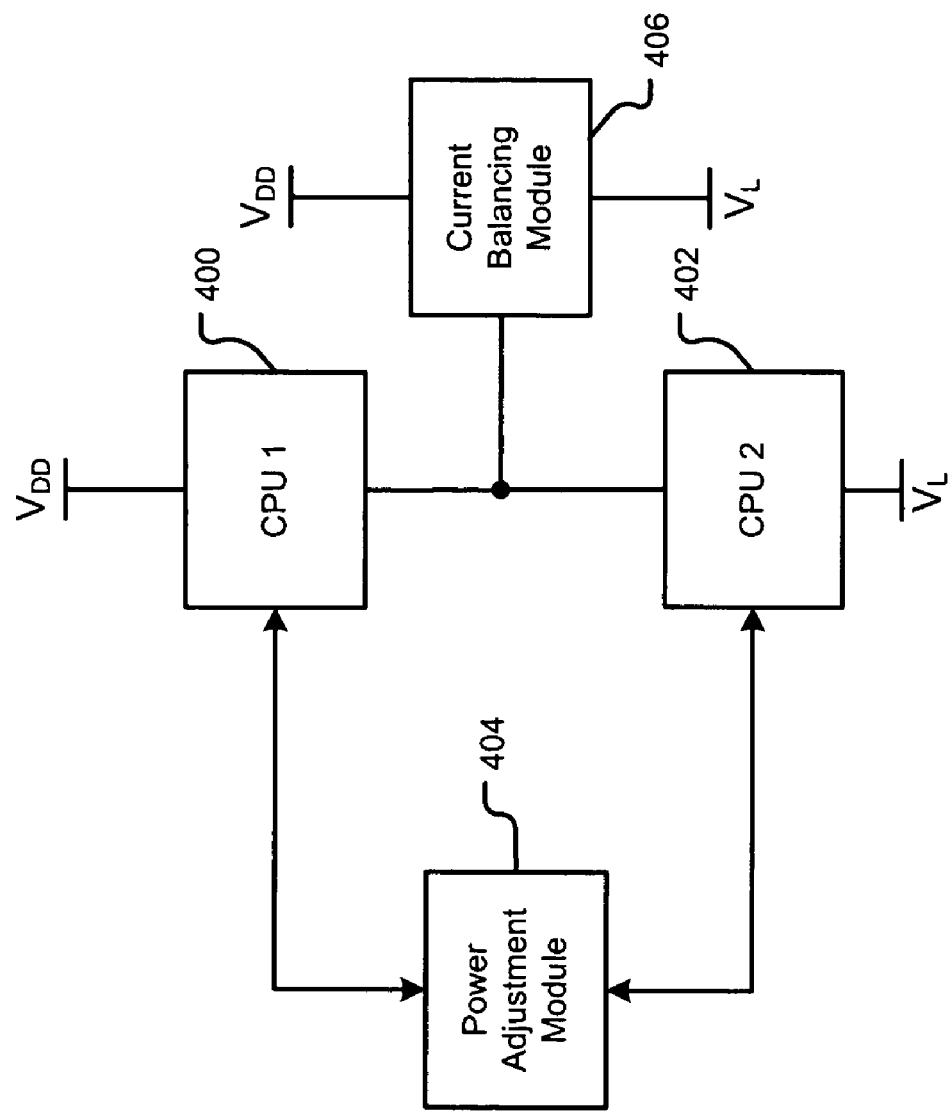
FIG. 12 is a functional block diagram illustrating first and second processors, a power adjustment module that balances current dissipation of the first and second processors and an optional current balancing module.

Referring now to FIG. 12, first and second processors 400 and 402 communicate with a power adjustment module 404 that balances current dissipation of the first and second processors 400 and 402. In some implementations, the power adjustment module 404 is hardware-based, software-based, and/or hardware and software based. In some implementations, the power adjustment module 404 adjusts relative operating frequencies of the first and second processors to attempt to balance current dissipation. The power adjustment module 404 may also use load balancing and/or throttling of the first and second processors 400 and 402 to attempt to balance current dissipation. In some implementations, the power adjustment module 404 is used in conjunction with an optional current balancing module 406, as described above and below. In other words, the power adjustment module 404 performs rough balancing and the current balancing module performs fine current balancing.

Referring now to FIGS. 13A, 13B and 13C, the power management module 404 includes a frequency balancing module 404'. An optional 2:1 DC/DC converter 406' may also be used to further balance current dissipation. In FIG. 13B, an exemplary layout of the first and second processors 400 and 402 and the 2:1 DC/DC converter 406' are shown fabricated on a semiconductor die 408. In FIG. 13C, the semiconductor die 408 of FIG. 13B is connected to a PCB 412 by first and second sockets 414 and 416 that are arranged on the PCB 412. Inductors 420 and 422 that were described above and that are associated with the 2:1 DC/DC converter 406 are arranged between the semiconductor die 408 and the PCB 412 in some embodiments. Pins 426 extend from the die 408 and are received in the sockets 414 and 416. While the power management module 404 is shown to include the frequency balancing module 404', skilled artisans will appreciate that hardware and/or software balancing of current may be performed in any of the ways described above and/or below.

Figure 14:
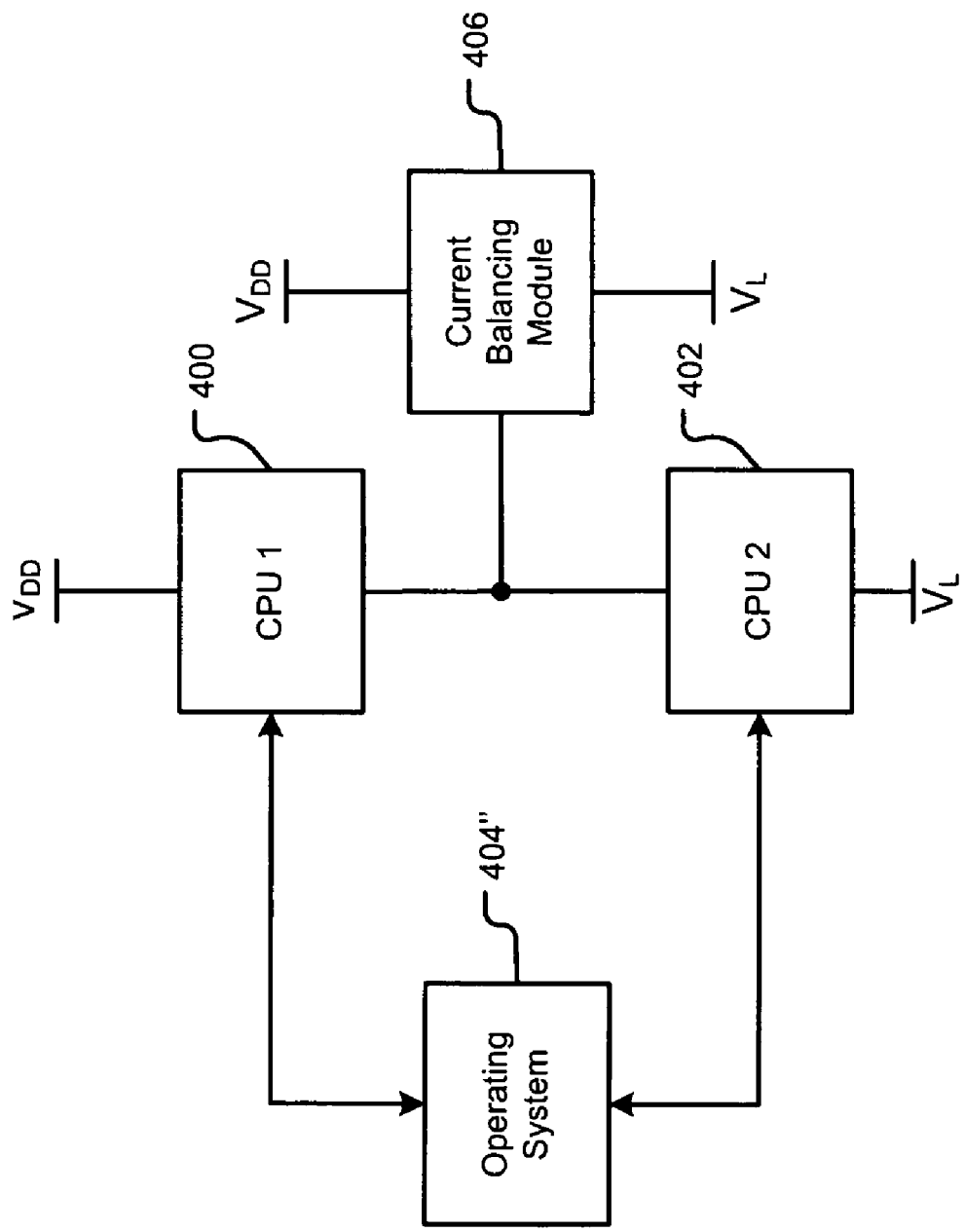
FIG. 14 is a functional block diagram illustrating first and second processors, an operating system that balances current dissipation of the first and second processors and an optional current balancing module.

Referring now to FIG. 14, the power adjustment module 404 includes an operating system 404". The OS 404" or chip can perform load balancing by assigning threads to the first and second processors 400 and 402. The OS 404" or chip can throttle the first and/or second processors 400 and 402 so that current imbalance is small. For example, CPU speed can be set as follows:

| | Speed | | | |
|---|---|---|---|---|
| CPU1 or CPU2 | 1 GHz | 2 GHz | 3 GHz | 4 GHz |
| CPU2 or CPU1 | 0 GHz | 1 GHz | 2 GHz | 3 GHz |

It is more efficient to run each CPU at ½ maximum frequency because each CPU can run at lower voltage. In some implementations, an operating frequency of one of the CPUs is lowered and/or increased to balance current dissipation of the other CPU. Alternately, dummy operations can be performed on at least one of the CPUs to balance current imbalance that would otherwise occur.

Referring back to FIGS. 4A, 4B, 5A and 7B, circuits and/or capacitors were used to ensure that the voltage at a node between the macros and/or modules is maintained below $V_{TH}$ and/or at approximately $V_{DD}/2$ during startup. Skilled artisans will appreciate that other implementations shown and described herein can also include the circuits and/or capacitors for maintaining the node between the macros and/or modules below $V_{TH}$ and/or at approximately $V_{DD}/2$ during startup.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A processing system comprising:
a first processing module;
a second processing module that communicates with the first processing module,
wherein the first processing module and the second processing modules are connected in series between a first reference potential and a second reference potentials; and
an operating system that communicates with the first and second processing modules, wherein the operating system performs throttling of the first and second processing modules to reduce a difference in current consumption between the first and second processing modules.

2. The processing system of claim 1, further comprising:
a current balancing module that communicates with a node between the first and second processing modules, wherein the current balancing module reduces the difference in current consumption between the first and second processing modules.

3. A method comprising:
providing a first processing module;
providing a second processing module that communicates with the first processing module,
wherein the first and second processing modules are connected in series between first and second reference potentials; and
performing throttling of the first and second processing modules to reduce the difference in current consumption between the first and second processing modules.

4. The method of claim 3, further comprising:
reducing a difference in current consumption between the first and second processing modules.

5. A processing system comprising:
first processing means for processing;
second processing means for processing that communicates with the first processing means,
wherein the first and second processing means are connected in series between first and second reference potentials; and
operating means for providing an operating system that communicates with the first and second processing means, wherein the operating means performs throttling of the first and second processing means to reduce a difference in current consumption between the first and second processing means.

6. The processing system of claim 5, further comprising:
current balancing means that communicates with a node between the first and second processing means, wherein the current balancing means reduces the difference in current consumption between the first and second processing means.

7. The processing system of claim 1, wherein the operating system performs load balancing of the first and second processing modules to reduce the difference in current consumption between the first and second processing modules.

8. The method of claim 3, further comprising:
performing load balancing of the first and second processing modules to reduce the difference in current consumption between the first and second processing modules.

9. The processing system of claim 5, wherein the operating means performs load balancing of the first and second processing means to reduce the difference in current consumption between the first and second processing means.

* * * * *